(12) United States Patent
Li et al.

(10) Patent No.: US 11,797,814 B2
(45) Date of Patent: Oct. 24, 2023

(54) PASSIVE WIRELESS MAGNETIC FIELD CHARACTERISTIC SENSING TAG AND SYSTEM, AND MAGNETIC FIELD QUANTITY ACQUISITION METHOD

(71) Applicant: University of Electronic Science and Technology of China, Sichuan (CN)

(72) Inventors: Zhenbing Li, Sichuan (CN); Gang Li, Sichuan (CN); Guangjun Wen, Sichuan (CN)

(73) Assignee: University of Electronic Science and Technology of China, Chengdu (CN)

( * ) Notice: Subject to any disclaimer, the term of this patent is extended or adjusted under 35 U.S.C. 154(b) by 256 days.

(21) Appl. No.: 17/388,278

(22) Filed: Jul. 29, 2021

(65) Prior Publication Data

US 2021/0357717 A1    Nov. 18, 2021

Related U.S. Application Data

(63) Continuation of application No. PCT/CN2020/115438, filed on Sep. 16, 2020.

(30) Foreign Application Priority Data

Sep. 16, 2019 (CN) .......................... 201910868810.1
Sep. 16, 2019 (CN) .......................... 201910868884.5
Feb. 28, 2020 (CN) .......................... 202010127783.5

(51) Int. Cl.
*G06K 19/07* (2006.01)
*G01V 15/00* (2006.01)

(52) U.S. Cl.
CPC ......... *G06K 19/0723* (2013.01); *G01V 15/00* (2013.01)

(58) Field of Classification Search
None
See application file for complete search history.

(56) References Cited

U.S. PATENT DOCUMENTS

2006/0145851 A1*   7/2006  Posamentier ...... G06K 19/0723
                                                            340/572.1

* cited by examiner

*Primary Examiner* — Jas A Sanghera

(57) ABSTRACT

Provided is a passive wireless magnetic field characteristic sensing tag and system, and a magnetic field quantity acquisition method, which integrates a passive magnetic field quantity sensor in a passive electronic tag and cooperates with a reader and a host computer to build a magnetic field sensing system, so as to realize high-precision and high-intelligence monitoring of the magnetic field quantity.

20 Claims, 9 Drawing Sheets

PASSIVE WIRELESS MAGNETIC FIELD CHARACTERISTIC SENSING TAG AND SYSTEM, AND MAGNETIC FIELD QUANTITY ACQUISITION METHOD

CROSS-REFERENCE TO RELATED APPLICATIONS

This application is a continuation of International Patent Application No. PCT/CN2020/115438, filed on Sep. 16, 2020, which claims the benefit of priority from Chinese Patent Application No. 201910868810.1, filed on Sep. 16, 2019; Chinese Patent Application No. 201910868884.5, filed on Sep. 16, 2019; and Chinese Patent Application No. 202010127783.5, filed on Feb. 28, 2020. The content of the aforementioned applications, including any intervening amendments thereto, is incorporated herein by reference.

TECHNICAL FIELD

This application relates to wireless sensor networks, and more particularly to a passive wireless magnetic field characteristic sensing tag and system, and a magnetic field quantity acquisition method.

BACKGROUND

Magnetic fields affect various aspects of human life. Extensive investigations have been conducted on the use and monitoring of magnetic fields, especially in some special fields, such as military and industrial production. Therefore, many magnetic field intensity measuring apparatuses have emerged, which generally have desirable measurement accuracy, but also have large size and high power consumption. Moreover, these apparatuses also need manual operation, and thus are not suitable for the high-precision, high-frequency and high-intelligence monitoring of magnetic field in some special occasions.

Magnetic field sensor is an inductive passive sensor that can sense the environmental magnetic field intensity, and its output signal will change linearly with the change of the environmental magnetic field intensity after excited by a signal with a specific frequency. The output signal can truly reflect the process and degree of the change of the magnetic field intensity after processing.

Wireless sensor networks (WSNs) are considered to be the second largest network after the Internet, and are known as one of the most influential technologies in the 21st century. WSN is a distributed sensor network, the tip of which is a sensor that can perceive the outside world. The sensors in the WSN communicate wirelessly, which lead to flexible network settings and changeable location of the device at any time. In addition, the sensor can also be connected and communicated with the Internet in a wired or wireless manner. Therefore, the introduction of WSN into the magnetic field monitoring can solve many problems in the prior art.

Radio frequency identification (RFID) technology is a traditional wireless communication identification technology, which can realize the non-line-of-sight communication, and is widely used in intelligent logistics, transportation, multi-target recognition and position tracking. After combined with the RFID technology, the WSN can simultaneously sense information and communication based on the target automatic identification characteristic of the radio frequency signal, and the sensor signal can experience a high-frequency and long-distance transmission. In view of this, the incorporation of RFID technology into the WSN is considered as the optimal approach for realizing the intelligent monitoring of the magnetic field quantity.

RFID writer, also known as "RFID reader", can automatically identify objects and obtain related data through radio frequency identification signals without manual intervention, and can be applied to the identification of high-speed moving objects and the simultaneous identification of multiple RFID tags.

Passive tag, namely passive RFID tag, adopts a frequency hopping working mode and has anti-interference ability. Users can customize the read and write of standard data with a scanning distance reaching ten meters or more. Passive RFID tags have a wide working frequency band, which not only complies with relevant industry regulations, but also facilitates flexible development and application. The dedicated reader of the passive RFID tags can read and write multiple tags at the same time. Due to its passive working characteristics, there are no requirements to provide a battery in the tag. The tag memory can be repeatedly erased and written more than 100,000 times. Due to the absence of a built-in battery, the electronic tag is kept in a low-power sleep state when it is located outside the communication recognition range of the reader. Within the communication recognition range of the reader, the electronic tag acquires electric energy from the radio frequency energy emitted by the reader. Passive electronic tags generally completes the transmission of electronic tag information to the reader by using backward scattering method, so the passive electronic tags can also be called passive tags, which are considered as excellent carriers for realizing the wireless magnetic field sensor networks based on RFID technology.

Currently, the magnetic field quantity is generally measured by a medium and large conventional magnetic field quantity sensing apparatus (represented by an active desktop apparatus, such as magnetometer) or a RFID-based small magnetic field quantity sensing system (semi-active or passive, such as a self-made or commercial magnetic field sensor chip).

Unfortunately, the existing magnetic field quantity sensing techniques generally suffers from the following defects.

1) The medium and large conventional magnetic field quantity sensing apparatuses generally have high power consumption and large volume. Most of these apparatuses adopt an active operation mode, and do not form a complete wireless transmission system of magnetic field quantity parameters. Moreover, they do not introduce the RFID technology and thus cannot realize long-distance wireless transmission of the magnetic field quantity parameters, which raises high requirements for the fixed power supply or portable battery, and also increases the cost of regular maintenance. In some cases that power supplies cannot be installed or batteries cannot be replaced, the application of these apparatuses will be greatly limited. Considering the large size and considerable manufacturing cost, the existing magnetic field quantity sensing apparatus is not suitable for the large-area layout of the sensor network.

2) The RFID-based small magnetic field sensing systems struggle with single acquisition mode and small space for secondary development, fail to ensure the measurement accuracy and sensitivity. Moreover, there are fewer alternatives, and these systems have low popularity.

SUMMARY

To overcome the problems in the prior art, this application provides a passive wireless magnetic field characteristic sensing tag and system, and a magnetic field quantity acquisition method using the same.

The technical solutions of this application are described as follows.

In a first aspect, this application provides a passive wireless magnetic field characteristic sensing tag, comprising:
- a first antenna;
- an impedance matching network power divider circuit;
- a rectification and energy management circuit;
- a low dropout (LDO) group;
- a demodulation circuit;
- a microprocessor;
- a magnetic field characteristic sensing circuit;
- a select switch circuit; and
- a back-scattering circuit;
- wherein the magnetic field characteristic sensing circuit is configured to sense a magnetic field quantity at a position where the passive wireless magnetic field sensing tag is located;
- the first antenna is configured to receive a radio frequency signal sent by a reader, and input the radio frequency signal into the impedance matching network power divider circuit; wherein the radio frequency signal comprises radio frequency energy and a command signal;
- the impedance matching network power divider circuit is configured to distribute the radio frequency signal and the radio frequency energy input by the first antenna;
- the rectification and energy management circuit is configured to convert the radio frequency energy into direct current electric energy usable for each circuit in the passive wireless magnetic field sensing tag, and store the direct current electric energy to intermittently supply power to each circuit in the passive wireless magnetic field sensing tag;
- the LDO group is configured to provide a direct current voltage for each circuit in the passive wireless magnetic field sensing tag;
- the demodulation circuit is configured to demodulate the command signal and convert the command signal into a baseband signal;
- the microprocessor is configured to parse the command signal and control each circuit in the passive wireless magnetic field sensing tag to work in accordance with a command of the reader;
- the select switch circuit is a one-of-three channel selector switch, which is configured to connect a signal channel required by the command of the reader under a control of the microprocessor; and
- the back-scattering circuit is configured to send a signal to the reader by backscattering.

In some embodiments, the microprocessor is a single chip microcomputer.

In a second aspect, this application provides a method for acquiring a magnetic field quantity based on the passive wireless magnetic field characteristic sensing system, comprising:

S1. when the host computer runs for the first time, initializing the reader and then inventorying all of the plurality of the passive wireless magnetic field sensing tags;

S2. executing step (S3) if the host computer sends a calibration command; or executing step (S4) if the host computer sends a magnetic field quantity parameter acquisition command;

S3. changing a magnetic field intensity around the plurality of the passive wireless magnetic field sensing tags, and controlling, by the host computer, the reader to send the magnetic field quantity parameter acquisition command to the plurality of the passive wireless magnetic field sensing tags; acquiring, by the plurality of the passive wireless magnetic field sensing tags, a magnetic field quantity parameter after receiving the magnetic field quantity parameter acquisition command, and returning, by the plurality of the passive wireless magnetic field sensing tags, an acquired magnetic field quantity parameter to the host computer; and changing the magnetic field intensity around the plurality of the passive wireless magnetic field sensing tags multiple times to obtain a comparison table between the magnetic field intensity and the magnetic field quantity parameter; and S4. controlling, by the host computer, the reader to send the magnetic field quantity parameter acquisition command to the plurality of the passive wireless magnetic field sensing tags; acquiring, by the plurality of the passive wireless magnetic field sensing tags, a magnetic field quantity parameter after receiving the magnetic field quantity parameter acquisition command, and returning, by the plurality of the passive wireless magnetic field sensing tags, an acquired magnetic field parameter to the host computer; and searching, by the host computer, the comparison table between the magnetic field intensity and the magnetic field quantity according to the acquired magnetic field quantity to obtain a magnetic field intensity of the environment sensed by the plurality of the passive wireless magnetic field sensing tags.

The beneficial effects of this application are as follows.

This application integrates the passive magnetic field sensor in the tag, and a magnetic field sensing system based on the RFID technology is built by matching with the reader and the host computer, so that the high-precision and high-intelligent monitoring of the magnetic field quantity is realized. The design of the single and dual-sensor acquisition mode compatible resonance type tag can switch the acquisition mode according to the control of the reader, which can not only monitor the constant magnetic field, but also monitor the alternating magnetic field. It is especially suitable for monitoring the magnetic field of power transmission equipment in a large power transmission center, so that the applicability of the passive wireless magnetic field characteristic sensing tag is improved.

DETAILED DESCRIPTION OF EMBODIMENTS

The embodiments of this application will be further described below with reference to the accompanying drawings. The resonance-type passive wireless magnetic field sensing tag is taken as an example to describe the passive wireless magnetic field sensing tag below.

Figure 1:
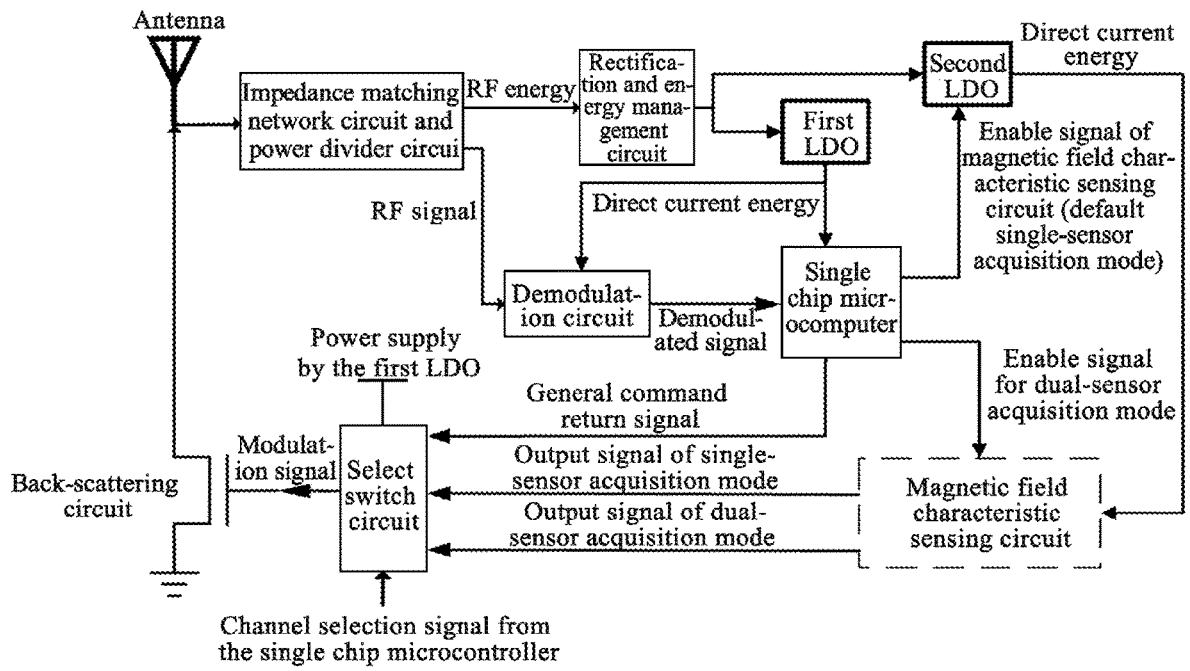
FIG. 1 is a schematic diagram of a resonance-type passive wireless magnetic field characteristic sensing tag based on an ultrahigh frequency RFID technology according to an embodiment of the disclosure.

As shown in FIG. 1, this application provides a passive wireless magnetic field characteristic sensing tag, including: a first antenna, an impedance matching network power divider circuit, a rectification and energy management circuit, a LDO group (a first LDO and a second LDO), a demodulation circuit, a microprocessor, a magnetic field characteristic sensing circuit, a select switch circuit and a back-scattering circuit.

The magnetic field characteristic sensing circuit is configured to sense a magnetic field quantity at a position where the passive wireless magnetic field sensing tag is located. The first antenna is configured to receive a radio frequency signal sent by a reader, and input the radio frequency signal into the impedance matching network power divider circuit. The radio frequency signal includes radio frequency energy and a command signal. The impedance matching network power divider circuit is configured to distribute the radio frequency signal and the radio frequency energy input by the first antenna. The rectification and energy management circuit is configured to convert the radio frequency energy into direct current electric energy usable by each circuit in the passive wireless magnetic field sensing tag, and store the direct current electric energy to intermittently supply power to each circuit in the passive wireless magnetic field sensing tag. The LDO group is configured to provide a high-precision direct current voltage for each circuit in the tag. The demodulation circuit is configured to demodulate the command signal and convert the command signal into a baseband signal. The microprocessor is configured to parse the command signal and control each circuit in the passive wireless magnetic field sensing tag to work in accordance with a command of the reader. The select switch circuit is a one-of-three channel selector switch, which is configured to connect a signal channel required by the command of the reader under a control of the microprocessor. The back-scattering circuit is configured to send a signal to the reader by backscattering. In some embodiments, the microprocessor is a single chip microcomputer.

Figure 2:
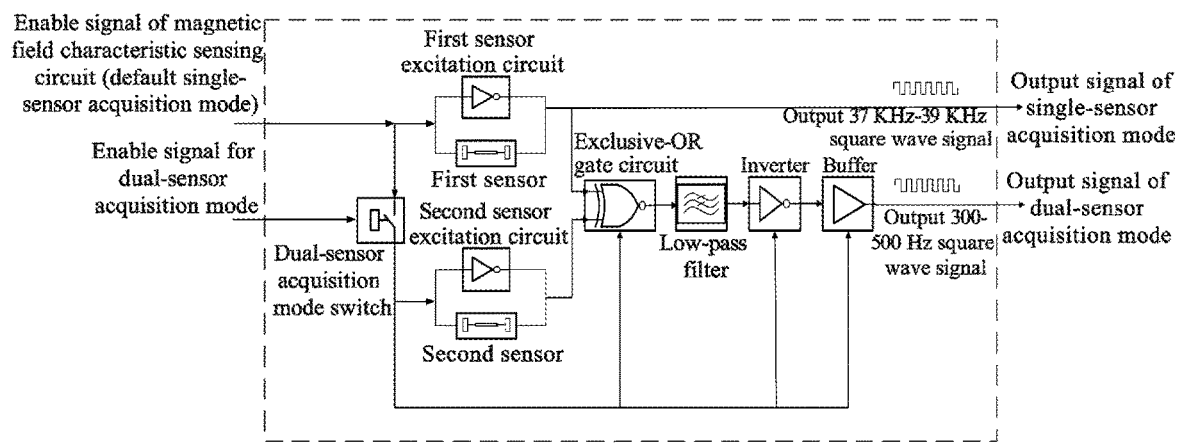
FIG. 2 is a schematic diagram of a resonance-type passive wireless magnetic field characteristic sensing circuit according to an embodiment of the disclosure.

In some embodiments, as shown in FIG. 2, the magnetic field characteristic sensing circuit is a sensing circuit integrating single and dual-sensor acquisition modes.

The magnetic field characteristic sensing circuit includes a dual-sensor acquisition mode switch, a first sensor, a first sensor excitation circuit, a second sensor, a second sensor excitation circuit, an Exclusive-OR (XOR) gate circuit, a low-pass filter, an inverter and a buffer; the Exclusive-OR gate circuit, the low-pass filter, the inverter and the buffer are connected in sequence. The first sensor and the first sensor excitation circuit are configured to work in the single-sensor acquisition mode, and output 37 KHz-39 KHz square wave signal through an output signal port of the single-sensor acquisition mode. The dual-sensor acquisition mode switch is configured to be turned on in the dual-sensor acquisition mode. The first sensor, the first sensor excitation circuit, the second sensor, the second sensor excitation circuit, the XOR gate circuit, the low-pass filter, the inverter and the buffer are configured to work simultaneously after the dual-sensor acquisition mode switch is turned on, and output 300 Hz-500 Hz square wave signal through an output signal port of the dual-sensor acquisition mode.

The characteristics of the single-sensor acquisition mode are low power consumption (the total power consumption of the magnetic field characteristic sensing circuit is one third of the dual-sensor acquisition mode) and the slightly lower accuracy (the single-sensor acquisition mode has temperature drift in the application environment with large temperature fluctuations, which affects the measurement accuracy).

The characteristics of the dual-sensor acquisition mode are high accuracy (the common mode noise introduced by temperature drift in the application environment with large temperature fluctuations can be suppressed, and the dual-sensor acquisition mode is not affected by temperature drift), high power consumption (the total power consumption of the magnetic field characteristic sensing circuit is three times that of the single sensor working mode) and low efficiency (low return signal frequency and long period). According to the requirements of measurement accuracy, work efficiency, power consumption and working distance in different application environments, this application proposes to coordinate the measurement accuracy, efficiency and power consumption of the tag by using a dual sensor and a single sensor to work together, so as to meet different applications demand.

The single sensor acquisition mode is the default working mode of the magnetic field characteristic sensing circuit. After the microprocessor parses the single-sensor acquisition mode command sent by the reader, the microprocessor sends the magnetic field characteristic sensing circuit enable signal to the second LDO to make the second LDO provides a high-precision direct current voltage to the magnetic field characteristic sensing circuit, so that the magnetic field characteristic sensing circuit works. At this time, the magnetic field characteristic sensing circuit is only in a single-sensor acquisition mode, that is, only the first sensor and the first sensor excitation circuit in the magnetic field characteristic sensing circuit are powered to work. In an initial state of zero magnetic field, the magnetic field characteristic sensing circuit outputs a square wave signal of 37 kHz-39 kHz. When the magnetic field characteristic sensing circuit senses a change in the magnetic field quantity, such as the increase in magnetic field strength, due to the resonance frequency of the first sensor changes (the frequency becomes higher), the square wave signal output by the magnetic field characteristic sensing circuit also changes (the frequency becomes higher), and vice versa. It should be noted that although the single-sensor acquisition mode has low power consumption, high efficiency and longer communication time between the tag and the reader, the single-sensor acquisition mode is inevitably affected by temperature drift, and the measurement accuracy is easily affected in application environments with large temperature fluctuations. Therefore, the single-sensor acquisition mode is more suitable for application in an application environment where the temperature is relatively constant and the communication time between the tag and the reader must be ensured for a long time.

After the microprocessor parses the dual-sensor acquisition mode command sent by the reader, the microprocessor turns on the dual-sensor acquisition mode switch in the magnetic field characteristic sensing circuit through the enable signal. At this time, the magnetic field characteristic sensing circuit is in the dual-sensor acquisition mode, that is, the first sensor, the first sensor excitation circuit, the second sensor, the second sensor excitation circuit and the signal conditioning circuit (the XOR circuit, the low-pass filter, the inverter and the buffer) in the magnetic field characteristic sensing circuit are configured to work simultaneously. The square wave signals (both 37 kHz-39 kHz) output by the first sensor excitation circuit and the second sensor excitation circuit are correspondingly connected to the two input ports of the XOR circuit. The output signal of the XOR circuit is a superposition of difference frequency signal and higher harmonic component of two input signals. The high-order harmonics of the first sensor and the second sensor are filtered out through the low-pass filter, and the XOR circuit output the difference frequency signal of the resonance signal of the first sensor and the second sensor. The difference frequency signal is a sinusoidal signal with a frequency of 300 Hz-500 Hz, and the sinusoidal signal is transformed into a square wave signal of the same frequency after the inverter, and the square wave signal is output after passing through a buffer. It should be noted that although the dual-sensor acquisition mode has high power consumption, low efficiency and shorter communication time between the tag and the reader, the dual-sensor acquisition mode can suppress the common mode interference caused by temperature drift, and the measurement accuracy can also be guaranteed in the application environment with large temperature fluctuation. Therefore, the dual-sensor acquisition mode is suitable for application in an application environment with large temperature fluctuations and a short communication time between the tag and the reader.

Figure 3:
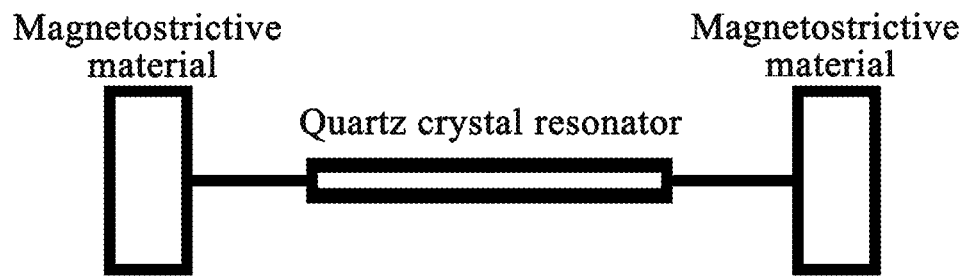
FIG. 3 is a schematic diagram of a resonance-type passive magnetic field sensor according to an embodiment of the disclosure.
Figure 4:
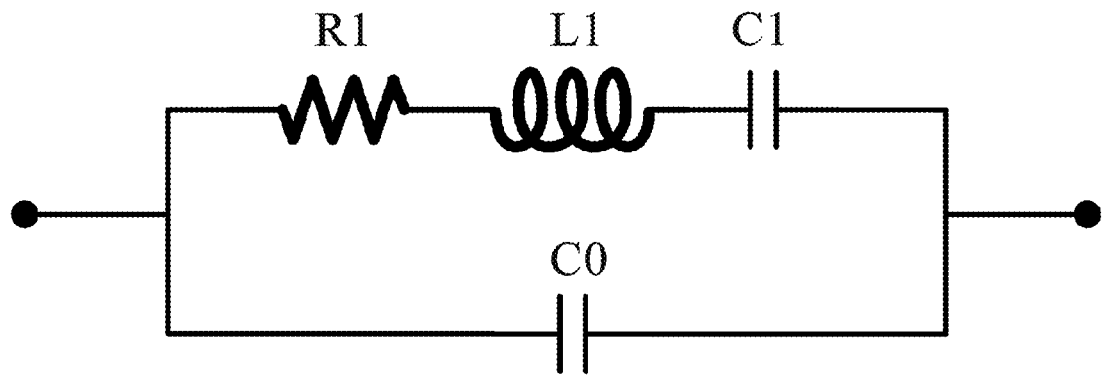
FIG. 4 is a schematic diagram of an equivalent circuit of the resonance-type passive magnetic field sensor according to an embodiment of the disclosure.

As shown in FIG. 3, in some embodiments, the first sensor and the second sensor are respectively a magnetic field quantity sensor, and the magnetic field quantity sensor is composed of a magnetostrictive material and a high-Q ($\geq 10^4$) quartz crystal resonator. The magnetostrictive material is deformed (extended or shortened) under the action of a magnetic field, and the deformation is transmitted to the quartz crystal resonator, thereby changing the resonance frequency of the entire magnetic field quantity sensor. The resonance frequency of the magnetic field sensor is 37 kHz-39 kHz, the range is ±50 Oe, the sensitivity is 3.5 Hz/Oe. The equivalent circuit of the magnetic field sensor is shown in FIG. 4.

Figure 5:
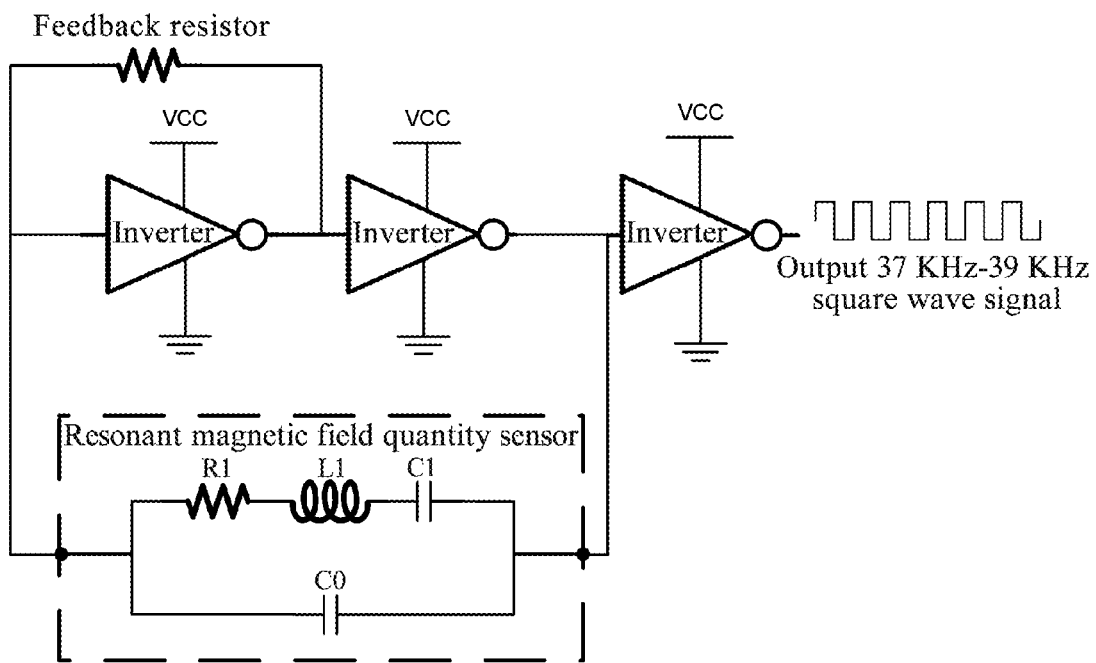
FIG. 5 is a schematic diagram of an excitation circuit of a resonance-type sensor according to an embodiment of the disclosure.

As shown in FIG. 5, in some embodiments, the first sensor excitation circuit and the second sensor excitation circuit both use gate oscillating circuits to excite the magnetic field quantity sensor to work. The gate oscillating circuit adopts a Schmitt trigger chip, and oscillation mode of the gate oscillating circuit is used to excite sensitive components to produce an oscillating output. The output signal of the gate oscillating circuit is a square wave. The working principle of the gate oscillating circuit is as follows. When the closed loop gain of the loop is greater than or equal to 1 and the total phase shift of the loop is zero or any integer multiple of $2\pi$ (360°), it can ensure that the gate oscillating circuit is at the resonance frequency of the magnetic field sensor. The feedback resistor is used to ensure that the first inverter works as an amplifier in its linear region, and the second inverter ensures that the total phase shift of the loop is $2\pi$ (360°). The magnetic field sensor is used as the feedback network of the oscillator to determine the frequency of the output signal of the gate oscillating circuit, and the output signal of the oscillator is a sinusoidal wave signal. The third inverter is used to convert the sinusoidal wave signal into a square wave signal of the same frequency, and to ensure that the signal amplitude is consistent with the power supply voltage.

When the tag is working, the reader sends radio frequency signals to the tag according to the host computer program. The first antenna receives the radio frequency signal sent by the reader, and inputs the radio frequency signal into the impedance matching network power divider circuit. The impedance matching network power divider circuit divides the input radio frequency signal into two part, a part of the radio frequency signal enters the rectification and energy management circuit in the form of radio frequency energy (RF energy). The rectification and energy management circuit is used to convert the radio frequency energy into direct current electric energy that can be used by the tag, and store the direct current electric energy. When the stored direct current electric energy reaches a certain threshold, the rectification and energy management circuit provides a direct current voltage to the LDO group (the first LDO and the second LDO).

The first LDO is in an on-state when it is powered on, and no additional enable signal is required. After the first LDO receives the direct current electric energy provided by the rectifier and energy management circuit, it immediately provides a high-precision direct current voltage to the demodulation circuit, the microprocessor and the select switch circuit to make the demodulation circuit, the microprocessor and the select switch circuit work. Therefore, at this time, the tag has been partially powered on and can receive the command signal sent by the reader. When the reader sends the RFID general command to the tag, the general command signal passes through the first antenna and the impedance matching network power divider circuit, and reaches the demodulation circuit that has been powered on in the form of radio frequency signal. The demodulation circuit demodulates the general command signal into a baseband signal, and sends the baseband signal to the microprocessor. The microprocessor parses the baseband signal and sends the general command return signal (baseband signal) to the select switch circuit through the designated channel, and control the select switch circuit to select the corresponding channel. At this time, the modulated signal output by the select switch circuit is the general command return signal, and the backscatter circuit sends the ASK type general command return signal to the reader through backscattering under the control of the modulated signal.

The second LDO is in an unopened state when it is powered on, and needs to be enabled to be turned on. After the microprocessor parses the single-sensor acquisition mode command sent by the reader, the microprocessor sends the magnetic field characteristic sensing circuit enable signal to the second LDO to turn on the second LDO. The second LDO provides high-precision direct current voltage to the magnetic field characteristic sensing circuit, so that the magnetic field characteristic sensing circuit works. At this time, the magnetic field characteristic sensing circuit is only in the single-sensor acquisition mode, that is, only the first sensor and the first sensor excitation circuit in the magnetic field characteristic sensing circuit work. The output signal (37 kHz-39 kHz square wave signal) of the magnetic field characteristic sensing circuit in the single-sensor acquisition mode is the magnetic field quantity parameter signal, which is sent to the select switch circuit through the designated channel. The microprocessor controls the select switch circuit to select the corresponding channel. At this time, the modulated signal output by the select switch circuit is the magnetic field quantity parameter signal in the single-sensor acquisition mode. The backscatter circuit sends the magnetic field quantity parameter signal under the ASK type single-sensor acquisition mode to the reader through backscattering under the control of the modulated signal.

After the microprocessor parses the dual-sensor acquisition mode command sent by the reader, the microprocessor turns on the dual-sensor acquisition mode switch in the magnetic field characteristic sensing circuit through the enable signal. At this time, the magnetic field characteristic sensing circuit is in the dual-sensor acquisition mode, that is, the first sensor, the first sensor excitation circuit, the second sensor, the second sensor excitation circuit and the signal conditioning circuit in the magnetic field characteristic sensing circuit work at the same time. The output signal (300 Hz-500 Hz square wave signal) of the magnetic field characteristic sensing circuit in the dual-sensor acquisition mode is the magnetic field quantity parameter signal, which is sent to the select switch circuit through the designated channel. The microprocessor controls the select switch circuit to select the corresponding channel. At this time, the modulated signal output by the select switch circuit is the magnetic field quantity parameter signal in the dual-sensor acquisition mode. The backscatter circuit sends the magnetic field quantity parameter signal under the ASK type dual-sensor acquisition mode to the reader through backscattering under the control of the modulated signal. The tag will run in the power-on state until the direct current electric energy stored in the rectification and energy management circuit is exhausted, that is, it will stop working until the next radio frequency signal sent by the reader will power up and activate the tag again. The intermittent sensing of the magnetic field quantity in the environment can be realized in this way.

Figure 6:
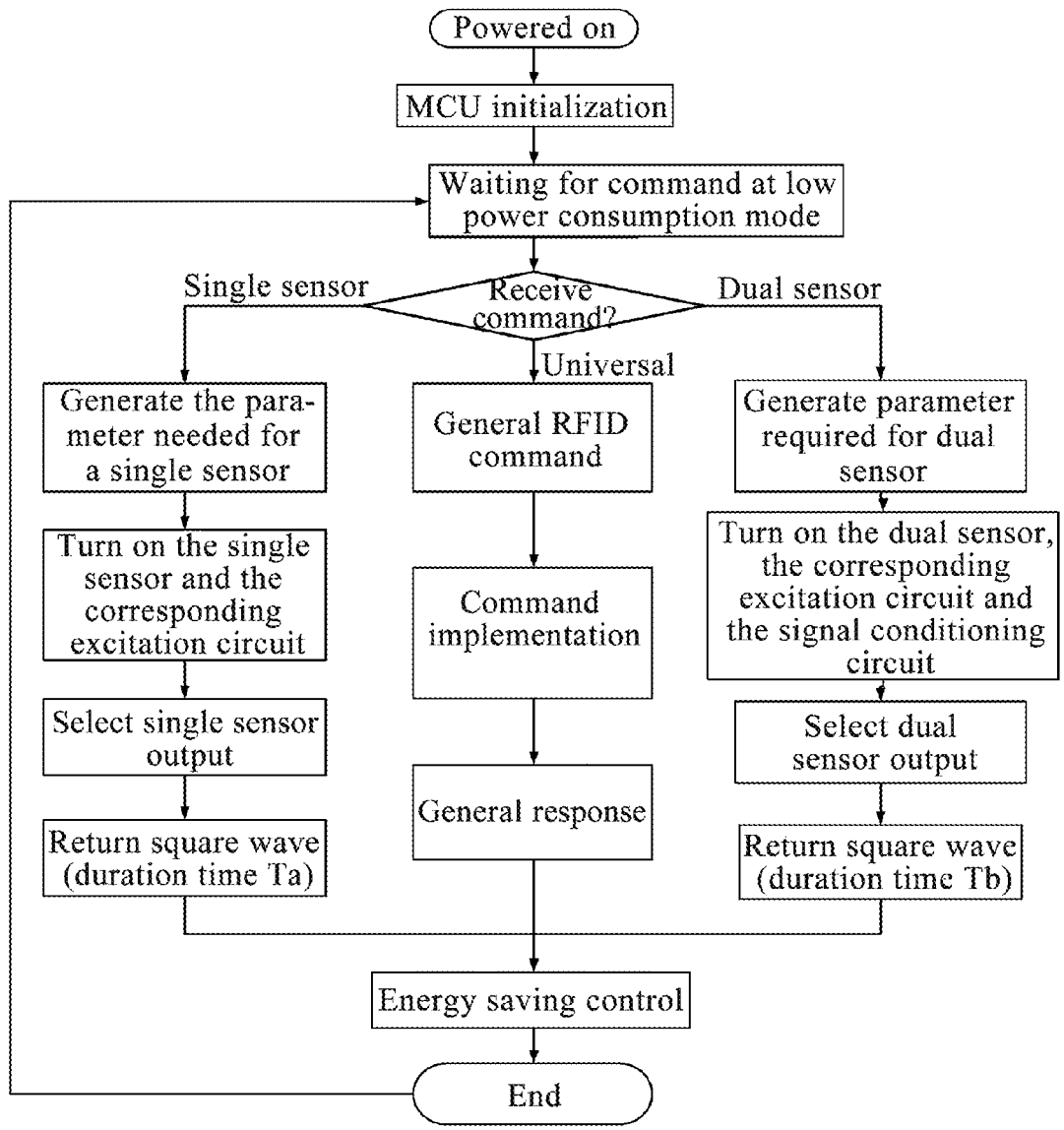
FIG. 6 is a flow chart of a resonance-type passive wireless magnetic field characteristic sensing tag according to an embodiment of the disclosure.

The passive resonance type magnetic field sensing tag of this application complies with the ISO/IEC 18000-6 Type C standard, and expands the function of the read command based on it. The flow chart of the passive resonance type magnetic field sensing tag is shown in FIG. 6. When the tag is powered on, the microprocessor first performs initialization, and then enters the low-power mode to wait for the reader to send commands. When the tag receives the command sent by the reader, if it is a general command, it executes all the commands in accordance with ISO/IEC 18000-6 Type C standard; when the tag receives the single-sensor acquisition mode command, the tag first turns on the first sensor and the first sensor excitation circuit, and then select the output of the magnetic field characteristic sensing circuit in the single-sensor acquisition mode as the output (output 37 kHz-39 kHz square wave) through the select switch circuit, and determine the duration Ta of the return square wave according to the number of read data in the read command; when the tag receives the dual-sensor acquisition mode command, the tag first turns on the first sensor, the first sensor excitation circuit, the second sensor, the second sensor excitation circuit and the signal conditioning circuit, and then select the output of the magnetic field characteristic sensing circuit in the dual-sensor acquisition mode as the output (output 300 Hz-500 Hz square wave) through the select switch circuit, and determine the duration Tb of the return square wave according to the number of read data in the read command.

The following uses the impedance type as an example to illustrate the tag.

Figure 7:
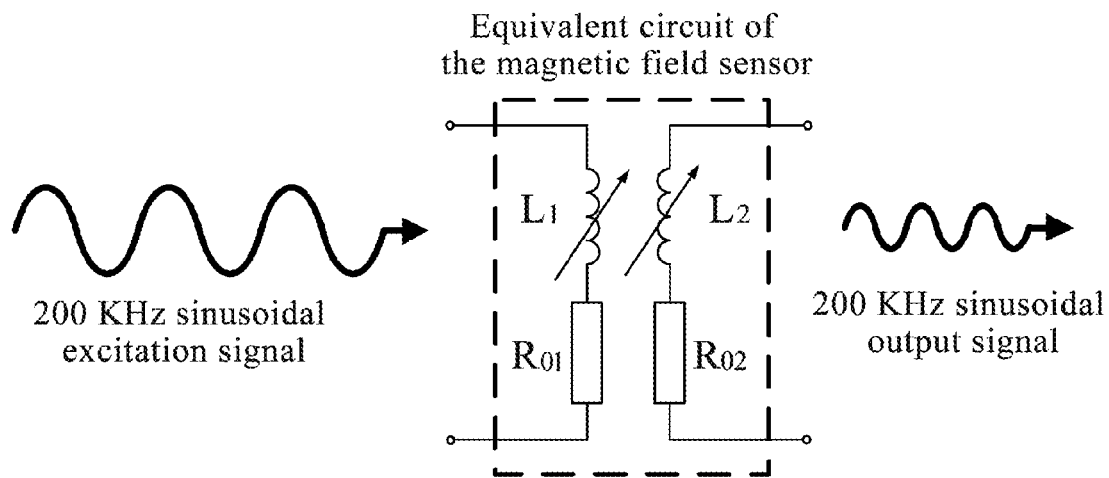
FIG. 7 is a schematic diagram of an equivalent circuit of a passive impedance-type magnetic field sensor according to an embodiment of the disclosure.
Figure 8:
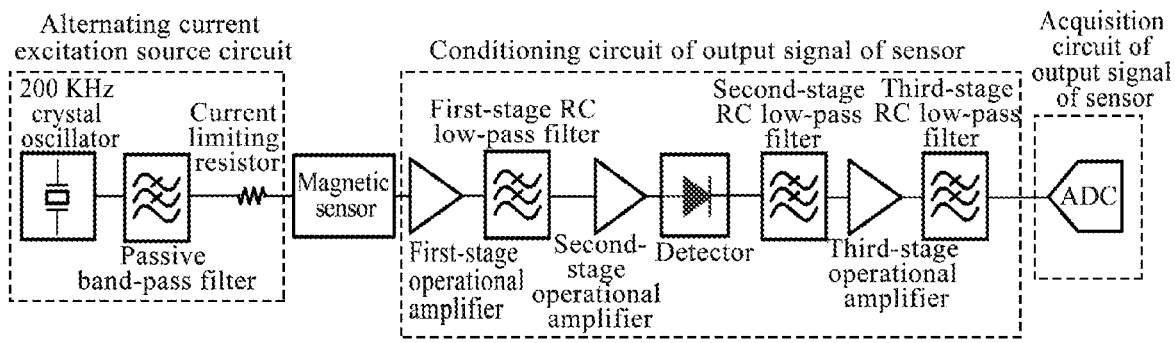
FIG. 8 is a schematic diagram of an impedance-type magnetic field characteristic sensing circuit according to an embodiment of the disclosure.
Figure 9:
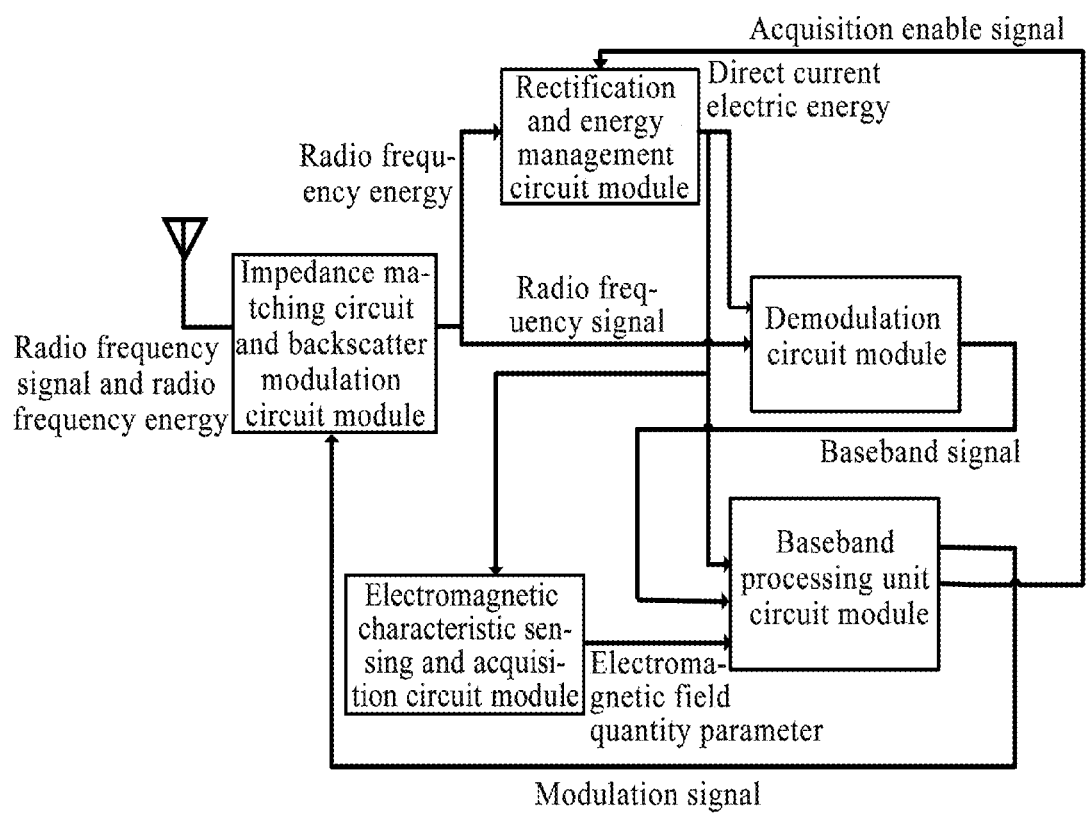
FIG. 9 is a schematic diagram of an impedance-type passive wireless magnetic field characteristic sensing tag circuit according to an embodiment of the disclosure.

As shown in FIGS. 7-9, in some embodiments, the magnetic field characteristic sensing circuit includes an alternating current excitation source circuit, a passive magnetic field sensor, a sensor output signal conditioning circuit and a sensor output signal acquisition circuit. The alternating current excitation source circuit is configured to output an excitation signal. The passive magnetic field sensor is configured to output an output signal related to a strength of a magnetic field surrounding the passive magnetic field sensor under an excitation of the excitation signal. The sensor output signal conditioning circuit is configured to process the output signal of the passive magnetic field sensor, and inputs a processed output signal into the sensor output signal acquisition circuit to allow the sensor output signal acquisition circuit to acquire characteristics of a magnetic field.

The alternating current excitation source circuit includes an oscillator, a passive band-pass filter and a current limiting resistor. The oscillator is configured to be powered by the direct current electric energy to oscillate, so as to output a 200 KHz square wave signal. The 200 KHz square wave signal is input into the passive band-pass filter to allow the passive band-pass filter to filter unwanted frequency components, thereby outputting a 200 KHz sinusoidal signal. The 200 KHz sinusoidal signal flows through the current limiting resistor to output the excitation signal. The active crystal oscillator starts to oscillate under the power supply of the rectifier and energy management circuit, so as to output the 200 KHz square wave signal. The 200 KHz square wave signal is input into the passive band-pass filter to filter unwanted frequency components, thereby outputting a 200 KHz sinusoidal signal. The 200 KHz sinusoidal signal flows through the current limiting resistor and then is input into the magnetic field sensor. The current limiting resistor fixes the output current of the alternating current excitation source circuit at about 200 μA, which is the smallest current that can excite the magnetic field sensor. Since the magnetic field sensor is equivalent to an inductor with an internal resistance as low as 10 ohms, and the current limiting resistor is configured to reduce the excessive power consumption when the magnetic field sensor is excited.

After the magnetic field sensor is excited by the output signal of the alternating current excitation source circuit, a tiny same-frequency signal with a peak value being about one-twentieth of the peak value of the excitation signal peak is output, and the same-frequency signal is input into the sensor output signal conditioning circuit for processing.

The sensor output signal conditioning circuit includes a first-stage operational amplifier, a first-stage resistor-capacitor (RC) low-pass filter, a second-stage operational amplifier, a detector, a second-stage RC low-pass filter, a third-stage operational amplifier and a third-stage RC low-pass filter. The output signal of the passive magnetic field sensor is used as an input of the first-stage operational amplifier. An output of the first-stage operational amplifier is used as an input of the first-stage RC low-pass filter. An output of the first-stage RC low-pass filter is used as an input of the second-stage operational amplifier; an output of the second-stage operational amplifier is used as an input of the detector. An output of the detector is used as an input of the second-stage RC low-pass filter. An output of the second-stage RC low-pass filter is used as an input of the third-stage operational amplifier. An output of the third-stage operational amplifier is used as an input of the third-stage RC low-pass filter. An output of the third-stage RC low-pass filter is used as an output of the sensor output signal conditioning circuit. The first-stage operational amplifier and the second-stage operational amplifier are both powered by dual power supplies (positive and negative power supplies). The third-stage operational amplifier is powered by a single power supply. When the sensor output signal conditioning circuit works, the output signal of the magnetic field sensor is amplified by the first-stage operational amplifier and then enters the first-stage RC low-pass filter. The first-stage RC low-pass filter filters the high-frequency noise in the output signal and inputs it into the second-stage operational amplifier, and the second-stage operational amplifier amplifies the output signal again and then sequentially inputs it into the detector and the second-stage RC low-pass filter to obtain the envelope signal after the sinusoidal signal is amplified. The envelope signal is sequentially input into the third-stage operational amplifier and the third-stage RC low-pass filter, thereby improving the signal-to-noise ratio of the envelope signal, and finally the envelope signal is input into the sensor output signal acquisition circuit.

The sensor output signal acquisition circuit is a 12-bit analog-to-digital converter (ADC) integrated in the microprocessor. The sensor output signal acquisition circuit works under the power supply of the rectification and energy management circuit. The sensor output signal acquisition circuit receives the output signal from the sensor output signal conditioning circuit, performs analog-to-digital conversion, and finally sends the digital signal after the analog-to-digital conversion to microprocessor for processing, so as to realize the sensing and acquisition of magnetic field characteristics.

The impedance matching network power divider circuit includes two outputs. One of the two outputs is configured to enter the rectification and energy management circuit, and the other one of the two outputs is configured to enter the demodulation circuit.

The rectification and energy management circuit is configured to convert the radio frequency energy into the direct current electric energy, and the direct current electric energy is configured to supply power to the demodulation circuit, the microprocessor and the magnetic field characteristic sensing circuit.

The demodulation circuit is configured to input a demodulated command signal to the microprocessor for processing. The microprocessor is configured to parse the demodulated command signal, and output a modulation signal according to the demodulated command signal. The microprocessor is configured to input the modulation signal to the back-scattering circuit, and the back-scattering circuit is configured to transmit an intensity of the magnetic field back to the reader by backscattering.

When the tag is working, the 920 MHz-928 MHz radio frequency signal and the radio frequency energy sent by the reader are input into the impedance matching network power divider circuit by the antenna. The radio frequency signal and radio frequency energy input about four-fifths of the radio frequency energy into the rectification and energy management circuit through the impedance matching network power divider circuit, and carry out radio frequency-direct current (RF-DC) conversion and acquisition, so that about one fifth of the radio frequency signal is input into the demodulation circuit for demodulation.

The rectification and energy management circuit includes a voltage-doubling rectification circuit, a DC-DC energy management chip, an energy storage capacitor and an LDO linear voltage regulator. The voltage-doubling rectification circuit is configured to convert the radio frequency energy input by the first antenna into the direct current electric energy, and input the direct current electric energy into the DC-DC energy management chip. The DC-DC energy management chip is configured to boost the direct current electric energy, and store a boosted direct current electric energy into the energy storage capacitor. When the boosted direct current electric energy stored in the energy storage capacitor reaches a set threshold, the DC-DC energy management chip controls the energy storage capacitor to input 2.4V direct current electric energy into the LDO linear voltage regulator, and controls the LDO linear voltage regulator to output 2V direct current electric energy. When the voltage in the energy storage capacitor is discharged and drops to the set lower threshold, the rectification and energy management circuit stops supplying power to each circuit in the tag until the energy in the energy storage capacitor is charged to the set upper threshold next time. The upper threshold refers to the specific discharge voltage value controlled by the DC-DC energy management chip, that is, when the voltage in the energy storage capacitor is charged to the upper threshold, the DC-DC energy management chip starts to supply power to each circuit in the tag, so that the electric energy in the energy storage capacitor is released. The lower threshold refers to the specific stop discharge voltage value controlled by the DC-DC energy management chip, that is, when the voltage in the energy storage capacitor is discharged to the lower threshold, the DC-DC energy management chip stops supplying power to each circuit in the tag. In some embodiments, the upper threshold is 4.8 V, and the lower threshold is 2.4 V.

The energy storage capacitor is a tantalum capacitor.

The first antenna is configured to receive a magnetic field quantity parameter acquisition command sent by the reader, demodulate the magnetic field quantity parameter acquisition command and input the magnetic field quantity parameter acquisition command into the microprocessor, so that the microprocessor inputs an enable signal into the LDO linear voltage regulator, and the rectification and energy management circuit supplies power to the magnetic field characteristic sensing circuit.

The impedance type magnetic field sensing tag is based on the ISO/IEC 18000 international ultra-high frequency RFID standard protocol.

As shown in FIG. 7, the impedance type magnetic field sensor is made of an amorphous magnetic film (Fe—Ni—Mo amorphous film), which is encapsulated in laminates, and is equivalent to a transformer structure. When an external magnetic field acts on the magnetic field sensor, due to the movement of the magnetic domain walls and the domain rotation, the magnetic permeability of the magnetic film of the magnetic field sensor changes accordingly, and the equivalent inductance value (impedance value) of the magnetic field sensor is changed. After the magnetic field sensor is excited by a 200 KHz sinusoidal excitation signal, the peak value of the output sinusoidal signal peak will be negatively correlated with the surrounding magnetic field strength. In the change of the magnetic field quantity, the magnetic permeability of the magnetic film of the magnetic field sensor changes rapidly. Therefore, the magnetic field sensor can quickly sense and acquire the magnetic field quantity parameter in the environment, thereby realizing the real-time and sensitive sensing of the magnetic field quantity in the environment. Compared to the existing magnetic field sensor, the power consumption is lower, and the power consumption of the magnetic field sensor of this application is only 400 W during operation.

The magnetic field characteristic sensing circuit of this application uses a micro-power consumption operational amplifier, a passive low-pass filter and a detector circuit to build the low-power consumption sensor output signal conditioning circuit of this application. The sensor output signal acquisition circuit obtained by the self-carrying low-power consumption 12 bit precision ADC of the microprocessor is used to obtain high-precision magnetic field quantity parameter under the low-power consumption of the magnetic field characteristic sensing circuit is only 1.1 mW.

The demodulation circuit is composed of an envelope detection circuit, an averaging circuit and a comparator. The demodulated signal processed by the envelope detector circuit and the output signal of the averaging circuit are respectively input to the comparator. The comparator processes the demodulated signal and output signal, and inputs the processed baseband signal to the microprocessor for processing.

After the single-chip microcomputer in the microprocessor is powered on, it phrases the command of the reader input by the demodulation circuit. When the command of the reader is a magnetic field quantity parameter acquisition command, the single-chip microcomputer in the microprocessor sends the acquisition enable signal to the corresponding LDO linear voltage regulator in the rectification and energy management circuit, processes the magnetic field quantity parameter input by the magnetic field characteristic sensing circuit at the same time and converts the magnetic field quantity parameter into the modulated signal, and inputs the modulated signal into the backscatter circuit, so that the backscatter circuit transmits the magnetic field quantity parameter back to the reader through backscattering.

When the tag receives the command to acquire the magnetic field quantity sent by the reader, the magnetic field characteristic sensing circuit is powered on, and the microprocessor enables the corresponding linear regulator in the rectification and energy management circuit, and the magnetic field characteristic sensing circuit starts to work. The magnetic field characteristic sensing circuit is shown in FIG. 8. The magnetic field characteristic sensing circuit finally inputs the acquired magnetic field quantity parameter into the microprocessor for processing.

Figure 10:
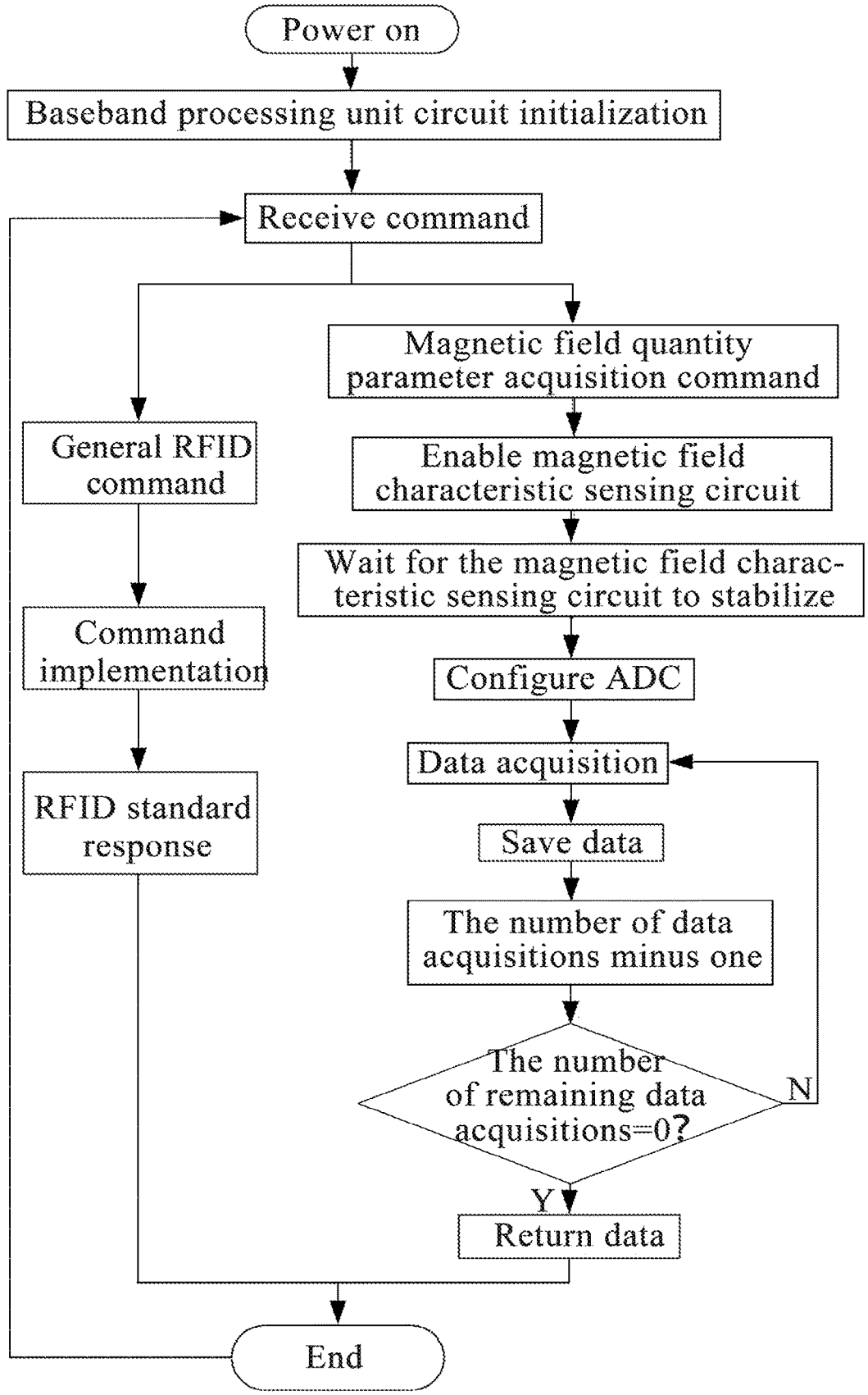
FIG. 10 is a workflow of a baseband signal processing unit of an impedance-type passive wireless magnetic field characteristic sensing tag according to an embodiment of the disclosure.

The operation flow chart of the microprocessor is shown in FIG. 10, and the microprocessor mainly used to implement the RFID protocol based on ISO/IEC 18000. When the rectification and energy management circuit starts to supply power to the microprocessor, the baseband processing unit circuit starts to work. First, the working status of each pin of the microprocessor is initialized and the first antenna is configured accordingly, and then commands from the host computer are received. When the host computer sends a general RFID command, the tag executes the command like a general RFID tag, and determines whether to return a signal according to the protocol. When the host computer sends a magnetic field quantity parameter acquisition command, the tag parses the command and obtains the number of acquisitions, and then enables the magnetic field characteristic sensing circuit. When the magnetic field characteristic sensing circuit is stable, the ADC is configured to acquire data and save the acquired data for reading at any time. After that, the microprocessor reduces the number of acquisitions by 1, and then judges whether the number of acquisitions is zero. If the number of acquisitions is not zero, the ADC continues to acquire data; otherwise, the acquired data will be returned to the reader by way of backscattering through the backscatter circuit. The reader can configure the number of sensing and acquired data according to specific application scenarios, so as to balance the relationship between the power consumption, time and accuracy of the tag according to the needs.

This application provides a passive wireless magnetic field characteristic sensing tag, which can obtain high-precision magnetic field quantity parameter under extremely low power consumption, and solve the large volume, high power consumption, high cost and the problems that a wireless transmission system based on the RFID technology is not realized and the precision of the magnetic field quantity parameter measurement is low.

This application provides a passive wireless magnetic field characteristic sensing tag, which uses a magnetic field sensor to output an output signal related to the surrounding magnetic field strength under the excitation of an excitation signal. The radio frequency energy received by the tag is converted into the direct current electric energy through the rectification and energy management circuit, and the direct current electric energy stored in the rectification and energy management circuit, thereby supplying power to each circuit in the tag. Compared with the prior art, the tag of this application has small size, strong invisibility, passive working mode and high measurement accuracy. After testing, the sensing and transmission distance can reach 4 m when the EIRP of the reader is 36 dBm, which is very conducive to the layout and realization of the wireless sensor network.

In the impedance type magnetic field characteristic sensing circuit of this application, the optimized device element is selected, so as to obtain a high-precision (1% accuracy) magnetic field quantity parameter with extremely low power consumption (1.1 mW). It has the advantages of reflecting the characteristics of static magnetic field and the 1 Hz-100 Hz alternating magnetic fields. It can draw a waveform diagram with the 1 Hz-100 Hz alternating magnetic field quantities which are in periodic change on software such as MATLAB (MATrix LABoratory) according to data returned by the tag. The tag based on the magnetic field characteristic sensing circuit of this application has the following beneficial effects.

1. The total volume of the passive wireless magnetic field characteristic sensing tag of this application is only 8 cm$^3$, which solves the problem of large volume of magnetic field quantity sensing apparatus in the prior art.

2. The passive wireless magnetic field characteristic sensing tag of this application is an automatic acquisition type passive electronic tag without a battery. The overall peak power consumption is less than 2.1 mW, and the overall average power consumption is less than 1.7 mW, which solves the problem of high power consumption of the magnetic field quantity sensing apparatus.

3. The passive wireless magnetic field characteristic sensing tag of this application has a low total cost, and a single tag does not exceed US$20, which solves the problem of high cost of the magnetic field quantity sensing apparatus in the prior art.

4. The passive wireless magnetic field characteristic sensing tag of this application has a simple structure, and does not need to replace the battery and is convenient for repairing and maintenance with a low maintenance cost, which solves the problem of difficult maintenance of the magnetic field quantity sensing apparatus in the prior art.

5. The passive wireless magnetic field characteristic sensing tag of this application has small size, strong invisibility, passive working mode and high measurement accuracy. After testing, the sensing and transmission distance can reach 4 m when the EIRP of the reader is 36 dBm, which is very conducive to the layout and realization of the wireless sensor network, and solves the problem of the difficulty in the wide-ranging layout of the magnetic field sensing apparatus in the prior art.

6. The passive wireless magnetic field characteristic sensing tag of this application also has the advantage of high accuracy in sensing and acquiring magnetic field quantity parameter. The error of the sensed magnetic field quantity parameter is effectively controlled below 1%, which solves the problem that the magnetic field sensing apparatus cannot achieve high-precision sensing in the low-power consumption operation state in the prior art.

7. The passive wireless magnetic field characteristic sensing tag of this application has the advantages of reflecting the characteristics of static magnetic field and the 1 Hz-100 Hz alternating magnetic fields, which can realize the real-time monitoring and detection of the static magnetic field and the alternating magnetic field around the power transmission equipment in a large power transmission unit and the power transmission line pipe.

The energy storage capacitor is configured to store the converted direct current electric energy.

The passive wireless magnetic field sensing tag starts to work when the direct current power in the energy storage capacitor reaches the set upper threshold.

The communication distance between the passive wireless magnetic field sensing tag and the reader is 4 m when the EIRP of the reader is 36 dBm.

The reader supports the ISO/IEC 18000 international ultrahigh frequency RFID standard protocol.

The reader includes a second antenna, and the reader is configured to send radio frequency energy and command signal to the passive wireless magnetic field sensing tag through the second antenna, and realize information interaction with the passive wireless magnetic field sensing tag through the second antenna.

The antenna is a 2 dBi linearly-polarized antenna. The passive wireless magnetic field sensing tag is configured to receive the radio frequency energy and command signal sent by the reader through the 2 dBi linearly-polarized antenna, and realize information interaction with the reader through the 2 dBi linearly-polarized antenna.

The following takes the resonance-type tag as an example to describe the passive wireless magnetic field sensing system.

This application provides a resonance type passive wireless magnetic field characteristic sensing system, the concept of which is consistent with that of the passive wireless magnetic field characteristic sensing tag mentioned above. For details that are not described in detail in the embodiment of the passive wireless magnetic field characteristic sensing system, please refer to the foregoing embodiment of the passive wireless magnetic field characteristic sensing tag.

This application provides a passive wireless magnetic field characteristic sensing system, which includes a plurality of the passive wireless magnetic field characteristic sensing tags arranged in an environment to be measured, a reader for reading and writing the plurality of the passive wireless magnetic field sensing tags, and a host computer for controlling the reader.

In operation, the reader first inventories the tags exist around it and records all the inventoried tags, and then selects the tag to implement a general function or a magnetic field quantity sensing function.

When the reader reads a user storage area with an address of 0x10, it indicates that a single-sensor is used for sensing a magnetic field quantity. When the reader reads a user storage area with an address of 0x12, it indicates that a dual sensor is used for sensing the magnetic field quantity.

The reader uses the number of read data in a read command to indicate a duration that the plurality of the passive wireless magnetic field sensing tags return the square wave.

When a highest bit of the number of read data is 1, the last 7 bits are used to indicate a duration of the square wave.

Figure 11:
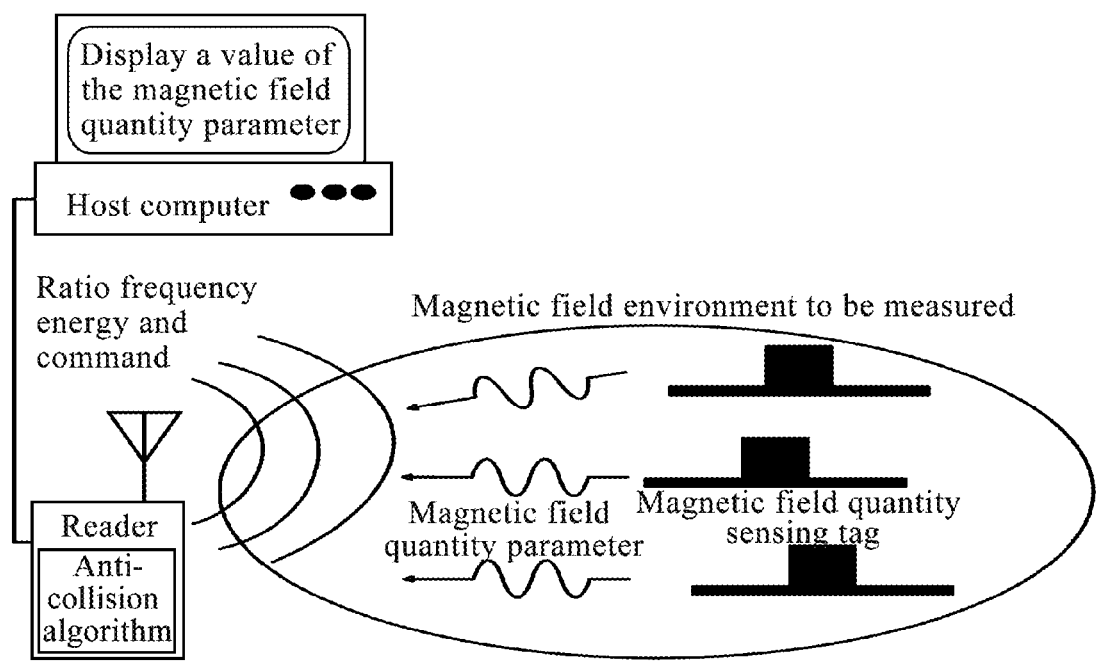
FIG. 11 is a schematic diagram of a passive wireless magnetic field characteristic sensing system according to an embodiment of the disclosure.

As shown in FIG. 11, this application provides a passive wireless magnetic field characteristic sensing system based on the ultrahigh frequency RFID technology, which includes a plurality of the passive wireless magnetic field characteristic sensing tags arranged in an environment to be measured, a reader for reading and writing the plurality of the passive wireless magnetic field sensing tags, and a host computer for controlling the reader.

Figure 12:
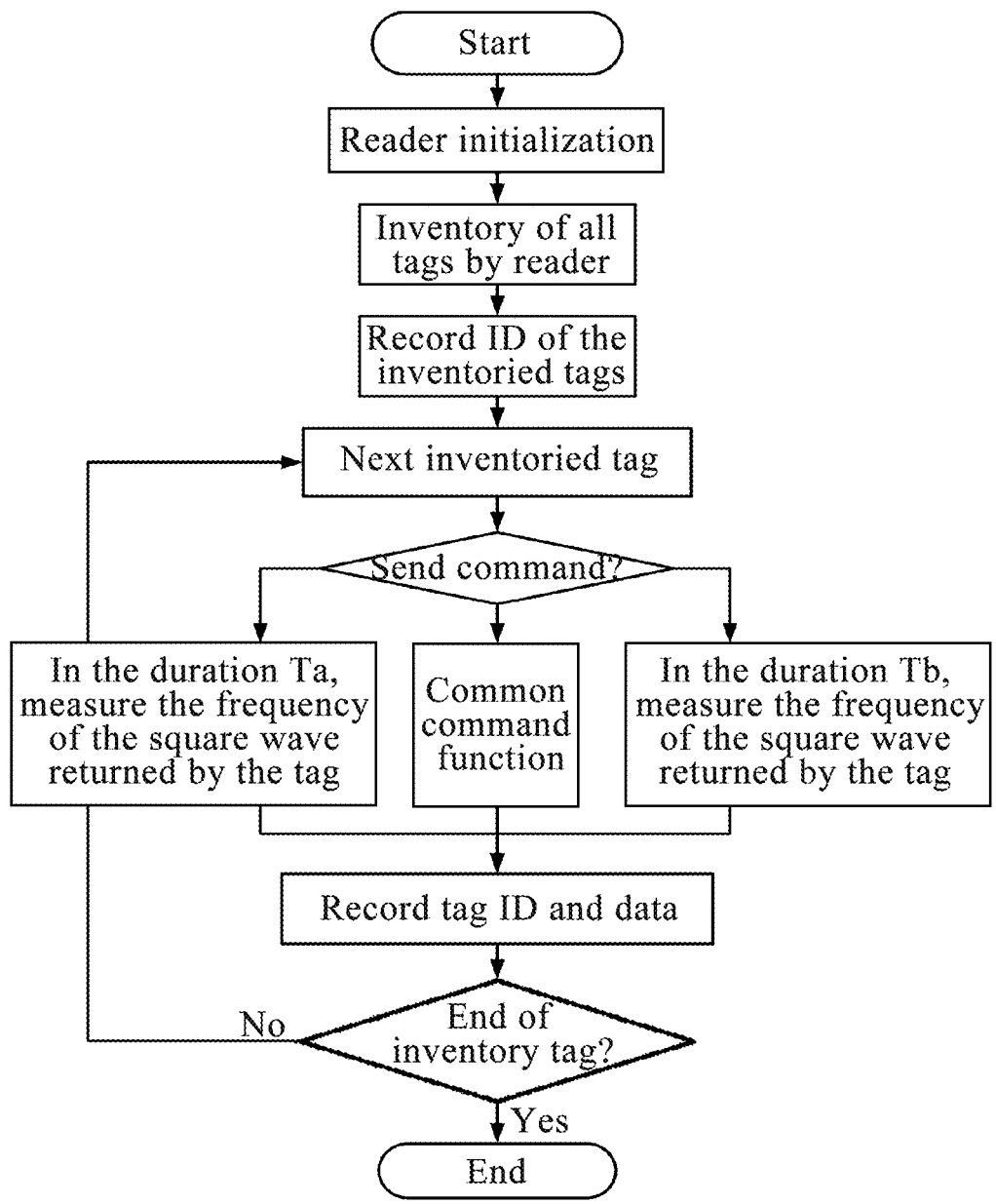
FIG. 12 is a flow chart of a resonance-type passive wireless magnetic field characteristic sensing system according to an embodiment of the disclosure.

As shown in FIG. 12, the host computer controls the working status of the reader and displays the magnetic field quantity parameter information returned by the plurality of the passive wireless magnetic field sensing tags. The reader sends the radio frequency signals to plurality of the passive wireless magnetic field sensing tags under the control of the host computer, and the radio frequency signals includes the radio frequency energy and command signal. The reader wirelessly charges and activates the plurality of the passive wireless magnetic field sensing tags, and controls the activated passive wireless magnetic field sensing tags to work according to the working mode set by the host computer (it can be RFID general working mode, dual-sensor acquisition mode and single-sensor acquisition mode). The passive wireless magnetic field sensing tag senses the magnetic field quantity parameter of the environment and returns it to the reader in the form of the frequency signal, and the host computer displays the magnetic field quantity parameter corresponding to the frequency signal. The passive wireless magnetic field sensing tag is placed in the environment to be measured, receives the radio frequency signal sent by the reader through the first antenna, converts the radio frequency signal into direct current electric energy for the tag to work, and stores the direct current electric energy. The passive wireless magnetic field sensing tag starts to work when the stored direct current electric energy reaches the set threshold. When the reader sends a command signal, the passive wireless magnetic field sensing tag runs the magnetic field characteristic sensing circuit according to the working mode set by the host computer. After the magnetic field characteristic sensing circuit senses the magnetic field quantity parameter of the environment, the magnetic field quantity parameter will be transmitted back to the reader in the form of frequency signals. When the direct current electric energy stored by the passive wireless magnetic field sensing tag this time is exhausted, the passive wireless magnetic field sensing tag will stop working until the radio frequency signal sent by the reader will power up and activate the passive wireless magnetic field sensing tag again. In this way, intermittent monitoring of the magnetic field quantity in the environment is realized. This method can ensure that the sensing range of the passive wireless magnetic field characteristic sensing system is large enough, that is, the effective communication distance between the reader and the plurality of the passive wireless magnetic field sensing tag is long enough. Generally, the effective communication distance between the reader and the the passive wireless magnetic field sensing tag is more than 4 m when the EIRP of the reader is 36 dBm. In a system where the plurality of the passive wireless magnetic field sensing tags work, this application proposes to expand the meaning of the number of data in the read command of ISO/IEC 18000-6 Type C standard to solve the collision problem, thereby improving the overall efficiency of the system and realizing multiple tags anti-collision features.

In some embodiments, the passive wireless magnetic field characteristic sensing system may include one reader and a plurality of the passive wireless magnetic field sensing tags. In operation, the reader first inventories the passive wireless magnetic field sensing tags existing around the reader and records all inventoried passive wireless magnetic field sensing tags (repeated tag is only recorded once), and then selects a passive wireless magnetic field sensing tag to implement a general function or a magnetic field quantity sensing function (single-sensor acquisition or dual-sensor acquisition). In order to be compatible with ISO/IEC 18000-6 Type C standard, the read command is expanded here. When the reader reads a user storage area with a read address of 0x10, it indicates that a single-sensor is used for sensing magnetic field quantity. When the reader reads the user storage area with the read address of 0x12, it indicates that a dual sensor is used for sensing magnetic field quantity.

Since the frequency of the square wave output by the magnetic field characteristic sensing circuit in the single-sensor acquisition mode and the dual-sensor acquisition mode is quite different, in order to improve the system efficiency and avoid the collision phenomenon of multiple tags, this application proposes to use the number of the read data in the read command to represent the duration of the square wave returned by the passive wireless magnetic field sensing tag (when a highest bit of the number of read data is 1, the last 7 bits are used to indicate the duration of the square wave, the specific duration represented by each bit is defined according to the specific application). The time for each tag to return to the square wave is staggered, and only one tag can return to the square wave at the same time, thereby avoiding collisions of multiple tags. The length of the duration can be selected according to the application scenario. The longer the duration, the higher the accuracy of the return signal frequency measured by the reader. The flow chart of the magnetic field characteristic sensing system is shown in FIG. 12.

This application integrates the magnetic field sensor in the tag, which has low cost and low power consumption, and is convenient maintenance, making the sensing system has the effects of high accuracy and large sensing range. The passive wireless magnetic field sensing tag of this application has the following characteristics.

1. The passive magnetic field sensing tag compatible with single and dual sensor acquisition modes can switch the acquisition mode according to the control of the reader to meet different application requirements.

2. The magnetic field quantity parameter of the corresponding environmental is detected through the frequency signal returned by the passive wireless magnetic field sensing tag.

3. On the basis of compatibility with ISO/IEC 18000-6 Type C standard, this application propose to extend the meaning of the user storage area and address representation of the read command to realize the customized magnetic field quantity acquisition command, so that the passive wireless magnetic field sensing tag can select single-sensor or dual-sensor acquisition mode according to the command.

4. By expanding the meaning of the number of data in the read command of ISO/IEC 18000-6 Type C standard, the overall efficiency of the system is improved, the multi-tag anti-collision function is realized, and the measurement accuracy of the reader can be improved to a certain extent (the longer the duration of the square wave returned by the passive wireless magnetic field sensing tag, the higher the frequency accuracy of the returned signal measured by the reader).

The invention adopts RFID technology to integrate the passive magnetic field sensor into the passive wireless magnetic field sensing tag supporting the ISO/IEC 18000 protocol, and forms a passive wireless magnetic field characteristic sensing system with a host computer and a reader that also supports the ISO/IEC 18000 protocol.

The host computer sends out acquisition commands, and wiredly controls the reader that supports the ISO/IEC 18000 international ultrahigh frequency RFID standard protocol. The reader sends the radio frequency energy and command signals to the passive wireless magnetic field sensing tag through the second antenna.

The following takes the impedance type as an example to describe the system.

The passive wireless magnetic field sensing tag also supports the ISO/IEC 18000 international ultrahigh frequency RFID standard protocol. The passive wireless magnetic field sensing tag is placed in the magnetic field, and the longest communication distance between the passive wireless magnetic field sensing tag and the reader is 4 m when the EIRP of the reader is 36 dBm. The passive wireless magnetic field sensing tag receives the radio frequency energy and the command signal sent by the reader through the 2 dBi linearly polarized antenna, converts the radio frequency energy into the direct current electric energy, and stores the direct current electric energy. The command signal is configured for demodulation and identification. When the direct current electric energy in the energy storage capacitor of the passive wireless magnetic field sensing tag is stored to the set upper threshold, the passive wireless magnetic field sensing tag starts to work. There is an impedance-type magnetic field sensor on the passive wireless magnetic field sensing tag. The peak value of the sinusoidal signal peak output by the impedance type magnetic field sensor is negatively correlated with the magnetic field quantity in the environment. The passive wireless magnetic field sensing tag processes and samples the output signal of the magnetic field sensor, obtains real-time magnetic field quantity parameter, and wirelessly transmits it back to the reader through backscattering.

The reader receives the magnetic field quantity parameter in the environment returned by the passive wireless magnetic field sensing tag, transmits the magnetic field quantity parameter to the host computer through a wired method. The host computer processes the returned magnetic field quantity parameter, and displays the magnetic field quantity parameter values, so as to complete the long-distance acquisition and transmission of the magnetic field quantity parameter in the environment.

The host computer controls the reader to work in a wired manner. The reader and the plurality of the passive wireless magnetic field sensing tags communicate by a RFID standard protocol. The plurality of the passive wireless magnetic field sensing tags are passive tags, and each of the plurality of the passive wireless magnetic field sensing tags includes a passive magnetic field sensor. When the passive magnetic field sensor is excited by a sinusoidal excitation signal of a specific frequency, a peak value of a same-frequency sinusoidal output signal peak output by the passive magnetic field sensor is in negative correlation with a magnetic field intensity of the environment to be measured.

The workflow of the microprocessor of the impedance type tag of this application is shown in FIG. 10, the microprocessor mainly implements the RFID protocol based on ISO/IEC 18000. When the rectification and energy management circuit starts to supply power to the microprocessor, the baseband processing unit circuit starts to work. First, the working status of each pin of the microprocessor is initialized and the first antenna is configured accordingly, and then commands from the host computer are received. When the host computer sends a general RFID command, the passive wireless magnetic field sensing tag executes the command like a general RFID tag, and determines whether to return a signal according to the protocol. When the host computer sends a magnetic field quantity parameter acquisition command, the passive wireless magnetic field sensing tag parses the command and obtains the number of acquisitions, enables the magnetic field characteristic sensing circuit, and then configures the ADC. When the magnetic field characteristic sensing circuit is stable, the ADC acquires the magnetic field quantity parameter one time or multiple times according to the command, and sends the acquired data to the host computer through backscattering by the backscatter circuit. The reader can configure the number of sensing and acquired data according to specific application scenarios, so as to balance the relationship between the power consumption, time and accuracy of the passive wireless magnetic field sensing tag according to the needs.

Figure 13:
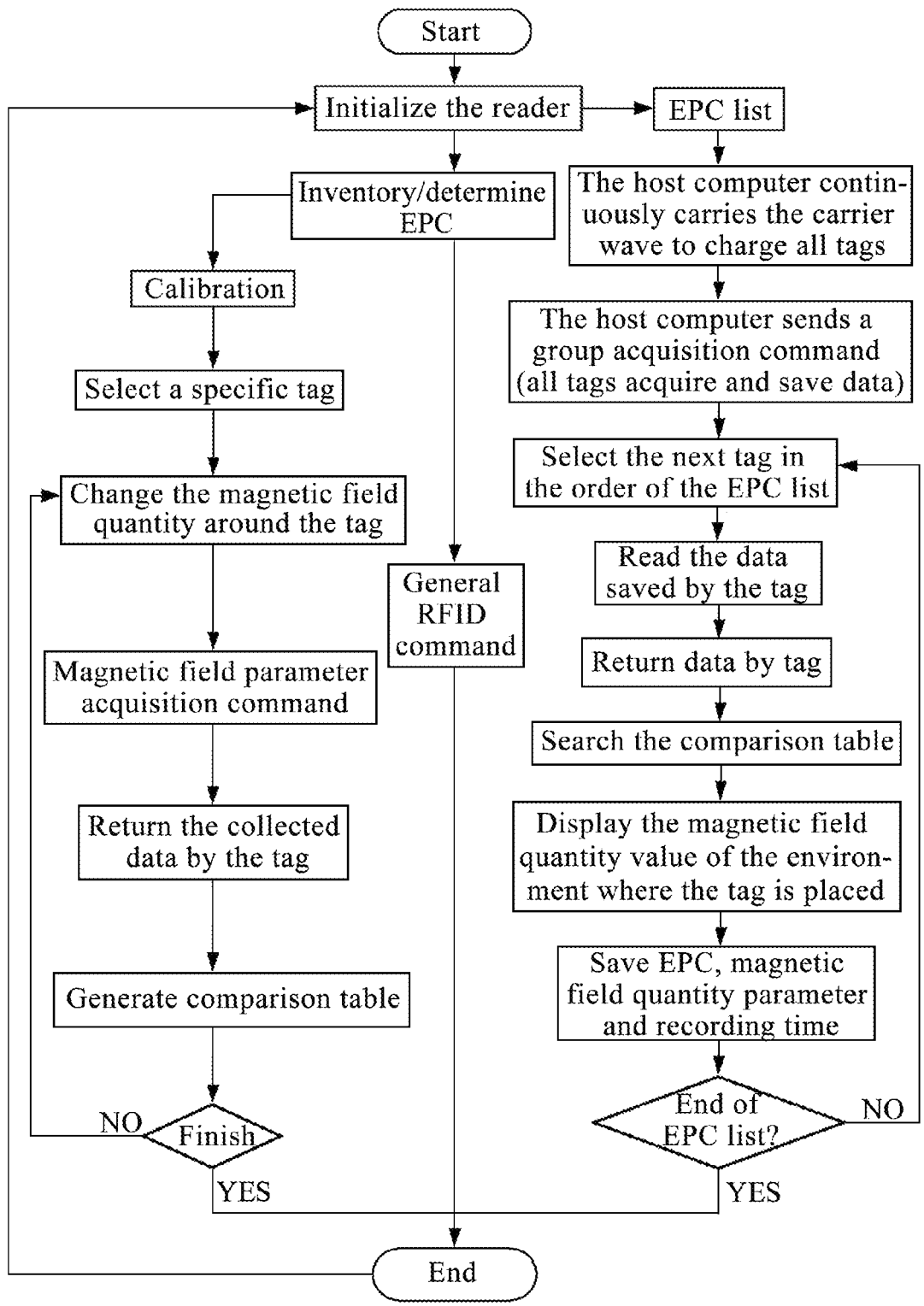
FIG. 13 is a flow chart of an impedance-type passive wireless magnetic field characteristic sensing system according to an embodiment of the disclosure.

This application realizes the acquisition of magnetic field parameter by adopting the workflow of the host computer software shown in FIG. 13. When the host computer runs for the first time, the host computer initialize the reader, and then inventories the surrounding plurality of the passive wireless magnetic field sensing tags or manually enter the determined tag electronic product code (EPC). When the host computer needs to perform calibration operations, the calibration process is executed. When the host computer needs to acquire the magnetic field quantity parameter, the magnetic field quantity acquisition is executed. Otherwise, the host computer performs general RFID operations.

Host computer calibration: before the host computer starts to perform the calibration operation, it needs to inventory the surrounding tags (or manually enter the EPC of the passive wireless magnetic field sensing tag), and then select a specific passive wireless magnetic field sensing tag through the host computer for calibration. The intensity of the magnetic field around the passive wireless magnetic field sensing tag is manually changed, and then the host computer controls the reader to issue a magnetic field quantity parameter acquisition command. After the reader receives the acquired data returned by the passive wireless magnetic field sensing tag, the host computer records the current magnetic field strength and the acquired data in the comparison table. The complete comparison table of the magnetic field quantity and the acquired data are finally obtained through multiple changes of the magnetic field strength.

Magnetic field data acquisition: the host computer can send general RFID command or magnetic field quantity parameter acquisition command when it is working normally. Before acquiring the magnetic field quantity parameter, the host computer needs to inventory the plurality of the passive wireless magnetic field sensing tags (or provide an EPC list), and then select a passive wireless magnetic field sensing tags to acquire the magnetic field quantity parameter. The host computer can acquire the magnetic field quantity parameter of a single tag or multiple tags. In the acquisition the magnetic field quantity parameter of a single tag, the reader first inventories the surrounding tags to obtain the EPC list of multiple tags, and then select a passive wireless magnetic field sensing tag that needs to execute the acquisition command to acquire the magnetic field quantity parameter. If the acquisition of the magnetic field quantity parameter of multiple tags is needed, the EPC of multiple specific tags can be listed in a file to form an EPC list. The host computer sends a continuous carrier wave to charge all tags. After all tags are charged, the host computer issues a group acquisition command, and all tags acquire the magnetic field quantity parameter and save the acquired data to the designated storage space (the host computer can configure the number of acquired data). Then the host computer selects the specific tag for reading operation according to the order of the EPC list, so as to obtain the magnetic field quantity parameter acquired by the passive wireless magnetic field sensing tag. When the host computer receives the magnetic field quantity parameter returned by the passive wireless magnetic field sensing tag, the magnetic field quantity value of the corresponding magnetic field quantity parameter is found corresponding to the comparison table generated by the calibration and displayed on the host computer, and the current EPC, magnetic field quantity value, recording time and other information are saved. Then, the host computer determines whether the EPC list is over, if it is over, it jumps to the end state, otherwise it continues to execute the next tag in the EPC list.

This application provides a passive wireless magnetic field characteristic sensing system based on RFID technology, which can realize high-precision and long-distance wireless transmission of the magnetic field quantity by using the host computer, the reader and the passive wireless magnetic field characteristic sensing tag with the advantages of low power consumption, low cost, high-precision sensing and long-distance wireless transmission, and solves the problem that the magnetic field sensing apparatus in the prior art does not realize the long-distance wireless transmission of the magnetic field quantity parameter based on the RFID technology.

This application provides a passive wireless magnetic field characteristic sensing system, which can be applied to the fields of electronic communication technology and sensor technology, and solves the problem of high power consumption, large volume, high cost, difficult maintenance, etc. of the existing magnetic field quantity sensing apparatus. The passive wireless magnetic field characteristic sensing system of this application is based on the RFID wireless communication technology. The passive magnetic field sensor is used herein to output an output signal related to the surrounding magnetic field strength under the excitation of an excitation signal. The radio frequency energy sent by the reader is received by the passive wireless magnetic field characteristic sensing tag and is converted into the direct current electric energy by the rectification and energy management circuit, and the direct current electric energy is stored to supply power to the passive wireless magnetic field characteristic sensing tag during the operation. Compared to the prior art, this application not only can reduce the volume of the magnetic field quantity sensing apparatus, but also has lower production cost, the smaller power consumption and the high accuracy, and can realize long-distance wireless sensing.

The passive wireless magnetic field characteristic sensing system of this application includes a host computer, a reader and a passive wireless magnetic field characteristic sensing tag. The host computer controls the reader to work in a wired manner. The reader and the plurality of the passive wireless magnetic field characteristic sensing tags communicate by the RFID standard protocol. The plurality of the passive wireless magnetic field characteristic sensing tags are passive tags. This application has the following advantages.

1. This application introduces RFID technology and constructs a passive wireless magnetic field characteristic sensing system, which can perform remote sensing and transmission of magnetic field quantity parameter, and solve the problem that the magnetic field sensing apparatus in the prior art does not realize the construction of remote distance wireless magnetic field quantity parameter transmission system based on RFID technology.

2. The total volume of the passive wireless magnetic field characteristic sensing tag used in this application is only 8 $cm^3$, which solves the problem of large volume of the magnetic field sensing apparatus in the prior art.

3. The passive wireless magnetic field characteristic sensing tag of this application is a passive electronic tag with automatic energy harvesting, which does not require a battery. The overall peak power consumption of the passive wireless magnetic field characteristic sensing tag is less than 2.1 mV, and the overall average power consumption is less than 1.7 mV. This application solves the problem of high power consumption of the magnetic field sensing apparatus in the prior art.

4. The passive wireless magnetic field characteristic sensing tag of this application has a low total cost, and the cost a single tag is not more than 90 RMB, which solves the problem of high cost of the magnetic field quantity sensing apparatus in the prior art.

5. The passive wireless magnetic field characteristic sensing tag of this application has a simple structure, and does not need to replace the battery and is convenient to repair and maintenance with low maintenance cost, which solves the problem of difficult maintenance of the magnetic field quantity sensing apparatus in the prior art.

6. The passive wireless magnetic field characteristic sensing tag of this application has size small and strong invisibility. The sensing and transmission distance can reach 4 m when the EIRP of the reader is 36 dBm, which is very conducive to the layout and implementation of wireless sensor network, and solves the problem that it is difficult to widely layout the magnetic field sensing apparatus in the prior art.

7. The passive wireless magnetic field characteristic sensing tag of this application also has the advantage of high accuracy for sensing and acquiring the magnetic field quantity parameter. The error of sensing magnetic field quantity parameter is effectively controlled below 1%, which solves the problem that the magnetic field sensing apparatus cannot realize high-precision sensing in the low power consumption state in the prior art.

8. The passive wireless magnetic field characteristic sensing tag of this application has the advantages of reflecting the characteristics of static magnetic field and the 1 Hz-100 Hz alternating magnetic fields, which can realize the real-time monitoring and detection of the static magnetic field and the alternating magnetic field around the power transmission equipment in a large power transmission unit and the power transmission line pipe.

This application provides a magnetic field quantity acquisition method based on the passive wireless magnetic field characteristic sensing system, the concept of which is consistent with that of the passive wireless magnetic field characteristic sensing system mentioned above. For details that are not described in detail in the embodiment of the magnetic field quantity acquisition method, please refer to the foregoing embodiment of the passive wireless magnetic field characteristic sensing system.

This application provides a method for acquiring magnetic field quantity acquisition based on the passive wireless magnetic field characteristic sensing system, the plurality of passive wireless magnetic field characteristic sensing tag being impedance-type tags, and the method has the following specific steps.

S1. When the host computer runs for the first time, the reader is initialized and then all of the passive wireless magnetic field sensing tags are inventoried.

S2. Step (S3) is executed if the host computer sends a calibration command, or step (S4) is executed if the host computer sends a magnetic field quantity parameter acquisition command.

S3. The magnetic field intensity around the plurality of the passive wireless magnetic field sensing tags is changed, and the reader is controlled, by the host computer, to send the magnetic field quantity parameter acquisition command to the plurality of the passive wireless magnetic field sensing tags. The magnetic field quantity parameter is acquired by the plurality of the passive wireless magnetic field sensing tags after receiving the magnetic field quantity parameter acquisition command, and an acquired magnetic field parameter is returned to the host computer by the plurality of the passive wireless magnetic field sensing tags. The magnetic field intensity around the plurality of the passive wireless magnetic field sensing tags is changed multiple times to obtain a comparison table between the magnetic field intensity and the magnetic field quantity parameter.

S4. The reader is controlled by the host computer to send the magnetic field quantity parameter acquisition command to the plurality of the passive wireless magnetic field sensing tags. The magnetic field quantity parameter is acquired by the plurality of the passive wireless magnetic field sensing tags after receiving the magnetic field quantity parameter acquisition command, and an acquired magnetic field parameter is returned to the host computer. The magnetic field intensity sensed by the plurality of the passive wireless magnetic field sensing tags is obtained by searching the comparison table between the magnetic field intensity and the magnetic field quantity parameter according to the acquired magnetic field quantity parameter by the host computer.

Described above are only preferred embodiments of the present disclosure, and are not intended to limit the scope of the present disclosure. Any changes, modifications and improvements made by those skilled in the art without departing from the spirit of the present disclosure shall fall within the scope of the present disclosure.

What is claimed is:

1. A passive wireless magnetic field characteristic sensing tag, comprising:
 a first antenna;
 an impedance matching network power divider circuit;
 a rectification and energy management circuit;
 a low dropout (LDO) group;
 a demodulation circuit;

a microprocessor;
a magnetic field characteristic sensing circuit;
a select switch circuit; and
a back-scattering circuit;
wherein the magnetic field characteristic sensing circuit is configured to sense a magnetic field quantity at a position where the passive wireless magnetic field sensing tag is located;
the first antenna is configured to receive a radio frequency signal sent by a reader, and input the radio frequency signal into the impedance matching network power divider circuit; wherein the radio frequency signal comprises radio frequency energy and a command signal;
the impedance matching network power divider circuit is configured to distribute the radio frequency signal and the radio frequency energy input by the first antenna;
the rectification and energy management circuit is configured to convert the radio frequency energy into direct current electric energy usable for each circuit in the passive wireless magnetic field sensing tag, and store the direct current electric energy to intermittently supply power to each circuit in the passive wireless magnetic field sensing tag;
the LDO group is configured to provide a direct current voltage for each circuit in the passive wireless magnetic field sensing tag;
the demodulation circuit is configured to demodulate the command signal and convert the command signal into a baseband signal;
the microprocessor is configured to parse the command signal and control each circuit in the passive wireless magnetic field sensing tag to work in accordance with a command of the reader;
the select switch circuit is a one-of-three channel selector switch, which is configured to connect a signal channel required by the command of the reader under a control of the microprocessor; and
the back-scattering circuit is configured to send a signal to the reader by backscattering.

2. The passive wireless magnetic field sensing tag of claim 1, wherein the passive wireless magnetic field sensing tag is a resonant magnetic field sensing tag; and the magnetic field characteristic sensing circuit is a sensing circuit integrating single and dual-sensor acquisition modes.

3. The passive wireless magnetic field sensing tag of claim 2, wherein the magnetic field characteristic sensing circuit comprises a dual-sensor acquisition mode switch, a first sensor, a first sensor excitation circuit, a second sensor, a second sensor excitation circuit, an Exclusive-OR (XOR) gate circuit, a low-pass filter, an inverter and a buffer; the Exclusive-OR gate circuit, the low-pass filter, the inverter and the buffer are connected in sequence; the first sensor and the first sensor excitation circuit are configured to work in the single-sensor acquisition mode, and output a 37 KHz-39 KHz square wave signal through an output signal port of the single-sensor acquisition mode; the dual-sensor acquisition mode switch is configured to be turned on in the dual-sensor acquisition mode; the first sensor, the first sensor excitation circuit, the second sensor, the second sensor excitation circuit, the XOR gate circuit, the low-pass filter, the inverter and the buffer are configured to work simultaneously after the dual-sensor acquisition mode switch is turned on, and output a 300 Hz-500 Hz square wave signal through an output signal port of the dual-sensor acquisition mode.

4. The passive wireless magnetic field sensing tag of claim 3, wherein the first sensor and the second sensor are respectively a magnetic field quantity sensor, and the magnetic field quantity sensor is composed of a magnetostrictive material and a high-Q quartz crystal resonator.

5. The passive wireless magnetic field sensing tag of claim 1, wherein the passive wireless magnetic field sensing tag is an impedance-type magnetic field sensing tag; the magnetic field sensing circuit comprises an alternating current excitation source circuit, a passive magnetic field sensor, a sensor output signal conditioning circuit and a sensor output signal acquisition circuit; the alternating current excitation source circuit is configured to output an excitation signal; the passive magnetic field sensor is configured to output an output signal related to a strength of a magnetic field surrounding the passive magnetic field sensor under an excitation of the excitation signal; and the sensor output signal conditioning circuit is configured to process the output signal of the passive magnetic field sensor, and inputs a processed output signal into the sensor output signal acquisition circuit to allow the sensor output signal acquisition circuit to acquire characteristics of the magnetic field surrounding the passive magnetic field sensor.

6. The passive wireless magnetic field sensing tag of claim 5, wherein the alternating current excitation source circuit comprises an oscillator, a passive band-pass filter and a current limiting resistor; the oscillator is configured to be powered by the direct current electric energy to oscillate, so as to output a 200 KHz square wave signal; the 200 KHz square wave signal is input into the passive band-pass filter to allow the passive band-pass filter to filter unwanted frequency components, thereby outputting a 200 KHz sinusoidal signal; and the 200 KHz sinusoidal signal flows through the current limiting resistor to output the excitation signal.

7. The passive wireless magnetic field sensing tag of claim 6, wherein the sensor output signal conditioning circuit comprises a first-stage operational amplifier, a first-stage resistor-capacitor (RC) low-pass filter, a second-stage operational amplifier, a detector, a second-stage RC low-pass filter, a third-stage operational amplifier and a third-stage RC low-pass filter; the output signal of the passive magnetic field sensor is used as an input of the first-stage operational amplifier; an output of the first-stage operational amplifier is used as an input of the first-stage RC low-pass filter; an output of the first-stage RC low-pass filter is used as an input of the second-stage operational amplifier; an output of the second-stage operational amplifier is used as an input of the detector; an output of the detector is used as an input of the second-stage RC low-pass filter; an output of the second-stage RC low-pass filter is used as an input of the third-stage operational amplifier; an output of the third-stage operational amplifier is used as an input of the third-stage RC low-pass filter; an output of the third-stage RC low-pass filter is used as an output of the sensor output signal conditioning circuit; and the sensor output signal acquisition circuit is a 12-bit analog-to-digital converter (ADC) integrated in the microprocessor.

8. The passive wireless magnetic field sensing tag of claim 5, wherein the impedance matching network power divider circuit comprises two outputs; one of the two outputs is configured to enter the rectification and energy management circuit, and the other one of the two outputs is configured to enter the demodulation circuit;
the rectification and energy management circuit is configured to convert the radio frequency energy into the direct current electric energy; and the direct current electric energy is configured to supply power to the demodulation circuit, the microprocessor and the magnetic field characteristic sensing circuit; and the demodulation circuit is configured to input a demodulated command signal to the microprocessor for processing; the microprocessor is configured to parse the demodulated command signal, and output a modulation signal according to the demodulated command signal; the microprocessor is configured to input the modulation signal to the back-scattering circuit, and the back-scattering circuit is configured to transmit an intensity of the magnetic field back to the reader by backscattering.

9. The passive wireless magnetic field sensing tag of claim 8, wherein the rectification and energy management circuit comprises a voltage-doubling rectification circuit, a DC-DC energy management chip, an energy storage capacitor and an LDO linear voltage regulator; the voltage-doubling rectification circuit is configured to convert the radio frequency energy input by the first antenna into the direct current electric energy, and input the direct current electric energy into the DC-DC energy management chip; the DC-DC energy management chip is configured to boost the direct current electric energy, and store a boosted direct current electric energy into the energy storage capacitor; and when the boosted direct current electric energy stored in the energy storage capacitor reaches a set threshold, the DC-DC energy management chip controls the energy storage capacitor to input 2.4V direct current electric energy into the LDO linear voltage regulator, and controls the LDO linear voltage regulator to output 2V direct current electric energy.

10. The passive wireless magnetic field sensing tag of claim 9, wherein the first antenna is configured to receive a magnetic field quantity parameter acquisition command sent by the reader, demodulate the magnetic field quantity parameter acquisition command and input the magnetic field quantity parameter acquisition command into the microprocessor, so that the microprocessor inputs an enable signal into the LDO linear voltage regulator, and the rectification and energy management circuit supplies power to the magnetic field characteristic sensing circuit.

11. The passive wireless magnetic field sensing tag of claim 10, wherein the passive wireless magnetic field sensing tag starts to work when the direct current electric energy in the energy storage capacitor reaches a set upper threshold.

12. The passive wireless magnetic field sensing tag of claim 11, wherein the reader comprises a second antenna; the reader is configured to transmit the radio frequency energy and the command signal to the passive wireless magnetic field sensing tag through the second antenna, and realize information interaction with the passive wireless magnetic field sensing tag through the second antenna.

13. The passive wireless magnetic field sensing tag of claim 12, wherein the first antenna is a 2 dBi linearly-polarized antenna; and the passive wireless magnetic field sensing tag is configured to receive the radio frequency energy and the command signal sent by the reader through the 2 dBi linearly-polarized antenna, and realize information interaction with the reader through the 2 dBi linearly-polarized antenna.

14. A passive wireless magnetic field characteristic sensing system, comprising:
a plurality of the passive wireless magnetic field sensing tags of claim 1 arranged in an environment to be measured;
a reader for reading and writing the plurality of the passive wireless magnetic field sensing tags; and
a host computer for controlling the reader.

15. The passive wireless magnetic field sensing system of claim 14, wherein in operation, the reader first inventories passive wireless magnetic field sensing tags existing around the reader and records all inventoried passive wireless magnetic field sensing tags, and then selects a passive wireless magnetic field sensing tag to implement a general function or a magnetic field quantity sensing function.

16. The passive wireless magnetic field sensing system of claim 15, wherein in a case that the plurality of the passive wireless magnetic field sensing tags are resonant tags, when the reader reads a user storage area with an address of 0x10, it indicates that a single sensor is used for sensing a magnetic field quantity; and when the reader reads a user storage area with an address of 0x12, it indicates that a dual sensor is used for sensing the magnetic field quantity.

17. The passive wireless magnetic field sensing system of claim 15, wherein in a case that the plurality of the passive wireless magnetic field sensing tags are resonant tags, the reader uses the number of read data in a read command to indicate a duration that the plurality of the passive wireless magnetic field sensing tags return the square wave.

18. The passive wireless magnetic field sensing system of claim 17, wherein when a highest bit of the number of the read data is 1, the last 7 bits are used to indicate the duration that the plurality of the passive wireless magnetic field sensing tags return the square wave.

19. The passive wireless magnetic field sensing system of claim 14, wherein in a case that the plurality of the passive wireless magnetic field sensing tags are impedance-type tags, the host computer controls the reader to work in a wired manner; the reader and the plurality of the passive wireless magnetic field sensing tags communicate by a RFID standard protocol; each of the plurality of the passive wireless magnetic field sensing tags comprises a passive magnetic field sensor; when the passive magnetic field sensor is excited by a sinusoidal excitation signal of a specific frequency, a peak value of a same-frequency sinusoidal output signal peak output by the passive magnetic field sensor is in negative correlation with a magnetic field intensity of the environment to be measured.

20. A method for acquiring a magnetic field quantity based on the passive wireless magnetic field sensing system of claim 14, the plurality of the passive wireless magnetic field sensing tags being impedance-type tags, and the method comprising:
S1. when the host computer runs for the first time, initializing the reader and then inventorying all of the plurality of the passive wireless magnetic field sensing tags;
S2. executing step (S3) if the host computer sends a calibration command; or executing step (S4) if the host computer sends a magnetic field quantity parameter acquisition command;
S3. changing a magnetic field intensity around the plurality of the passive wireless magnetic field sensing tags, and controlling, by the host computer, the reader to send the magnetic field quantity parameter acquisition command to the plurality of the passive wireless magnetic field sensing tags; acquiring, by the plurality of the passive wireless magnetic field sensing tags, a magnetic field quantity parameter after receiving the magnetic field quantity parameter acquisition command, and returning, by the plurality of the passive wireless magnetic field sensing tags, an acquired magnetic field quantity parameter to the host computer; and changing the magnetic field intensity around the plurality of the passive wireless magnetic field sensing tags multiple times to obtain a comparison table between the magnetic field intensity and the magnetic field quantity parameter; and S4. controlling, by the host computer, the reader to send the magnetic field quantity parameter acquisition command to the plurality of the passive wireless magnetic field sensing tags; acquiring, by the plurality of the passive wireless magnetic field sensing tags, a magnetic field quantity parameter by the tag after receiving the magnetic field quantity parameter acquisition command, and returning, by the plurality of the passive wireless magnetic field sensing tags, an acquired magnetic field parameter to the host computer; and searching, by the host computer, the comparison table between the magnetic field intensity and the magnetic field quantity according to the acquired magnetic field quantity to obtain a magnetic field intensity of the environment sensed by the plurality of the passive wireless magnetic field sensing tags.

* * * * *